(12) United States Patent
Yamamoto et al.

(10) Patent No.: US 8,866,271 B2
(45) Date of Patent: Oct. 21, 2014

(54) SEMICONDUCTOR DEVICE MANUFACTURING METHOD, SUBSTRATE PROCESSING APPARATUS AND SEMICONDUCTOR DEVICE

(75) Inventors: Katsuhiko Yamamoto, Toyama (JP); Yuji Takebayashi, Toyama (JP); Tatsuyuki Saito, Toyama (JP); Masahisa Okuno, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/250,708

(22) Filed: Sep. 30, 2011

(65) Prior Publication Data
US 2012/0086107 A1 Apr. 12, 2012

(30) Foreign Application Priority Data

Oct. 7, 2010 (JP) .................................. 2010-227649
Nov. 11, 2010 (JP) .................................. 2010-252882

(51) Int. Cl.
| | | |
|---|---|---|
| H01L 21/26 | (2006.01) | |
| H01L 29/02 | (2006.01) | |
| H01L 21/02 | (2006.01) | |
| H01L 21/67 | (2006.01) | |
| C23C 16/56 | (2006.01) | |
| C23C 16/40 | (2006.01) | |
| H01L 49/02 | (2006.01) | |

(52) U.S. Cl.
CPC ...... *H01L 21/67115* (2013.01); *H01L 21/0228* (2013.01); *C23C 16/56* (2013.01); *H01L 21/02337* (2013.01); *H01L 21/02189* (2013.01); *C23C 16/405* (2013.01); *H01L 28/40* (2013.01); *H01L 21/02345* (2013.01)

USPC ............ 257/632; 257/E21.328; 257/E29.002; 438/795

(58) Field of Classification Search
USPC .......... 257/632, E21, E21.328; 438/301, 303, 438/261, 795
See application file for complete search history.

(56) References Cited

U.S. PATENT DOCUMENTS

| | | | |
|---|---|---|---|
| 6,428,894 B1 * | 8/2002 | Babich et al. ................ 428/408 |
| 7,615,259 B2 * | 11/2009 | Nishikawa .................... 427/535 |
| 7,674,710 B2 * | 3/2010 | Ashigaki et al. .............. 438/648 |
| 8,071,446 B2 * | 12/2011 | Terasaki ........................ 438/261 |
| 8,287,967 B2 * | 10/2012 | Nishikawa .................... 427/535 |
| 2006/0151491 A1 * | 7/2006 | Kim et al. ..................... 219/754 |
| 2007/0167029 A1 | 7/2007 | Kowalski et al. |
| 2007/0224839 A1 * | 9/2007 | Shimizu ........................ 438/795 |
| 2008/0099475 A1 * | 5/2008 | Lee et al. ...................... 219/730 |
| 2008/0135207 A1 * | 6/2008 | Fukuoka et al. ............... 165/65 |
| 2009/0011602 A1 * | 1/2009 | Nozawa et al. ............... 438/694 |
| 2009/0191358 A1 | 7/2009 | Perelaer et al. |
| 2009/0202720 A1 * | 8/2009 | Miyatani ..................... 427/248.1 |
| 2009/0233430 A1 * | 9/2009 | Hirano .......................... 438/591 |

(Continued)

FOREIGN PATENT DOCUMENTS

JP  02312254  12/1990
JP  2002-280380 A  9/2002

(Continued)

*Primary Examiner* — Shaun Campbell
*Assistant Examiner* — Thai T Vuong
(74) *Attorney, Agent, or Firm* — Volpe and Koenig, P.C.

(57) ABSTRACT

A semiconductor device manufacturing method includes loading a substrate, on which a high-k film is formed, into a processing chamber, performing a reforming process by heating the high-k film through irradiation of a microwave on the substrate, and unloading the substrate from the processing chamber.

9 Claims, 22 Drawing Sheets

(56) References Cited

U.S. PATENT DOCUMENTS

2009/0311876 A1* 12/2009 Terasaki .................. 438/765
2010/0055884 A1* 3/2010 Isogai et al. .................. 438/502

FOREIGN PATENT DOCUMENTS

| | | |
|---|---|---|
| JP | 2003-264187 A | 9/2003 |
| JP | 2007036206 A1 | 2/2007 |
| JP | 2007258286 A1 | 10/2007 |
| JP | 2009510747 A1 | 3/2009 |
| JP | 2009516375 A1 | 4/2009 |
| JP | 2010080537 A1 | 4/2010 |
| JP | 2010129790 | 6/2010 |
| KR | 10-2008-0019061 | 2/2008 |
| KR | 10-0979716 B1 | 9/2010 |
| WO | 2007002874 A1 | 1/2007 |

* cited by examiner

SEMICONDUCTOR DEVICE MANUFACTURING METHOD, SUBSTRATE PROCESSING APPARATUS AND SEMICONDUCTOR DEVICE

CROSS-REFERENCE TO RELATED APPLICATIONS

This application is based upon and claims the benefit of priority from Japanese Patent Application Nos. 2010-227649, filed on Oct. 7, 2010 and 2010-252882, filed on Nov. 11, 2010, the entire contents of which are incorporated herein by reference.

TECHNICAL FIELD

The present disclosure relates to a substrate processing technology for manufacturing a semiconductor device, such as an integrated circuit (IC), on a substrate, and more particularly relates to a semiconductor manufacturing apparatus for manufacturing a semiconductor device by processing a substrate such as a semiconductor wafer (hereinafter, referred to as a wafer), a substrate processing apparatus for processing a substrate, or a semiconductor device manufacturing method.

BACKGROUND

As an example of a film forming method for forming a film on a substrate, there are a Physical Vapor Deposition (PVD) method, a Chemical Vapor Deposition (CVD) method, and an Atomic Layer Deposition (ALD) method.

A PVD method refers to a method that forms a film of elements contained in a raw material on a substrate by using raw material atoms physically released in gas phase from a solid raw material by ion bombardment or heat energy. A CVD method refers to a method that forms a film of atoms contained in raw-material molecules by using the reaction of two or more kinds of raw materials in gas phase or on a substrate surface. Since the CVD method uses the reaction in gas phase or on the substrate surface, it has excellent step coverage as compared to the PVD method. The ALD method refers to a method that alternately supplies two or more kinds of raw materials, which are used for film formation, to a substrate one by one under a certain film forming condition (temperature or time) to adsorb the raw materials on the substrate in units of atomic layer, and forms a film through an atomic-layer-level control by using a surface reaction. For example, as disclosed in International Publication No. 2007/02874, the ALD method can be performed at a lower substrate temperature (processing temperature) than the CVD method and can control film thickness according to the number of film forming cycles.

In addition, as an insulating layer formed on a substrate, for example, there may be oxide and nitride of hafnium (Hf), zirconium (Zr) or aluminum (Al), which are high-k (high dielectric constant) films having a high relative dielectric constant. In particular, a hafnium oxide film ($HfO_x$), a zirconium oxide film ($ZrO_x$), and the like, which are high-k films, are formed by reacting an organic or inorganic material containing Hf or Zr with an oxidized gas such as oxygen ($O_2$) or ozone ($O_3$).

These techniques are used to form, for example, a capacitor electrode of a capacitor of a Dynamic Random Access Memory (DRAM) or a transistor gate structure. The capacitor has a laminated structure in which an insulating film is interposed between electrodes. By alternately forming a titanium nitride film (TiN film), a high-k film, and a titanium nitride film, a capacitor is formed to have a laminated structure in which the high-k film as a capacitive insulating film is interposed between the titanium nitride films being top and bottom electrodes. The titanium nitride film is formed using a Ti-containing gas such as titanium tetrachloride ($TiCl_4$) and a nitriding agent (nitrogen(N)-containing gas) such as ammonia ($NH_3$). As an example of the high-k film, a zirconium oxide film (ZrO film) is formed using an oxidizing agent (oxygen(O)-containing gas) such as tetrakis(ethylmethylamino)zirconium (TEMAZ:$Zr[N(CH_3)CH_2CH_3]_4$) and ozone ($O_3$). In addition, after the formation of the high-k film, crystallization annealing may be carried out in order to improve the relative dielectric constant. This is because the relative dielectric constant of the high-k film is dependent on the crystal structure thereof.

For example, in the case of a DRAM capacitor, a high-k film is formed on a bottom electrode being made of a titanium nitride film. Due to poor oxidizing ability of an oxidizing agent, instability of process conditions, or requirement for low temperature, all raw materials constituting the high-k film cannot be completely oxidized, and oxygen is liberated when crystallization annealing is carried out in order to improve the relative dielectric constant of the high-k film. For these reasons, defects may occur in the film. For example, oxygen may be lost in the high-k film or carbon (C) may remain in the high-k film. Since these film defects serve as a path through which an electric current flows, phenomenon causing defects such as an increase in leakage current of the capacitor or degradation of the capacitor may occur. In addition, if the optimization of the crystallization annealing is so insufficient that the crystal structure of the high-k film is not fully controlled, a crystal phase having a relatively low dielectric constant is dominant and large crystal particles that cannot realize a required relative dielectric constant are generated, causing an increase in leakage current.

SUMMARY

The present disclosure provides some embodiments of a semiconductor device manufacturing method, a substrate processing apparatus, and a semiconductor device, which can achieve optimization of crystal structure, acceleration of crystallization, reduction of oxygen defect, and reduction of residual impurity, during a manufacturing process of a semiconductor device with a high-k film, and can perform a reforming process suitable for an insulating film.

According to one embodiment of the present disclosure, provided is a semiconductor device manufacturing method, including: loading a substrate, on which a high-k film is formed, into a processing chamber; heating the high-k film through irradiation of a microwave on the substrate; and unloading the substrate from the processing chamber.

According to another embodiment of the present disclosure, provided is a substrate processing apparatus, including: a processing chamber; a microwave generating device configured to generate a microwave; a waveguide configured to supply the microwave generated in the microwave generating device to the processing chamber, and a control unit configured to control the microwave generating device to supply the microwave from the waveguide to the processing chamber accommodating a substrate on which a high-k film is formed.

According to another embodiment of the present disclosure, provided is a substrate processing apparatus, including: a reaction vessel configured to accommodate a plurality of substrates on which a high-k film is formed; a substrate support member configured to support the substrates stacked within the reaction vessel; a microwave generating device configured to generate a microwave; and a waveguide configured to supply the microwave generated in the microwave generating device to the reaction vessel, wherein the substrates are stacked in the substrate support member such that a space having a height of more than half a wavelength of the microwave supplied into the reaction vessel is formed on the top surface of the respective substrates, and the waveguide is installed on a sidewall of the reaction vessel.

DETAILED DESCRIPTION (First Embodiment)

An embodiment of the present disclosure will be described based on drawings.

In the current embodiment, a substrate processing apparatus system is a semiconductor manufacturing apparatus system that performs a substrate processing process, for example, a film forming process and a reforming process in a method for manufacturing a semiconductor device (Integrated Circuit (IC))

The substrate processing apparatus system includes a film forming processing apparatus 10 and a reforming processing apparatus 200.

<Structure of Film Forming Processing Apparatus>

First, the film forming processing apparatus 10 will be described.

Figure 1:
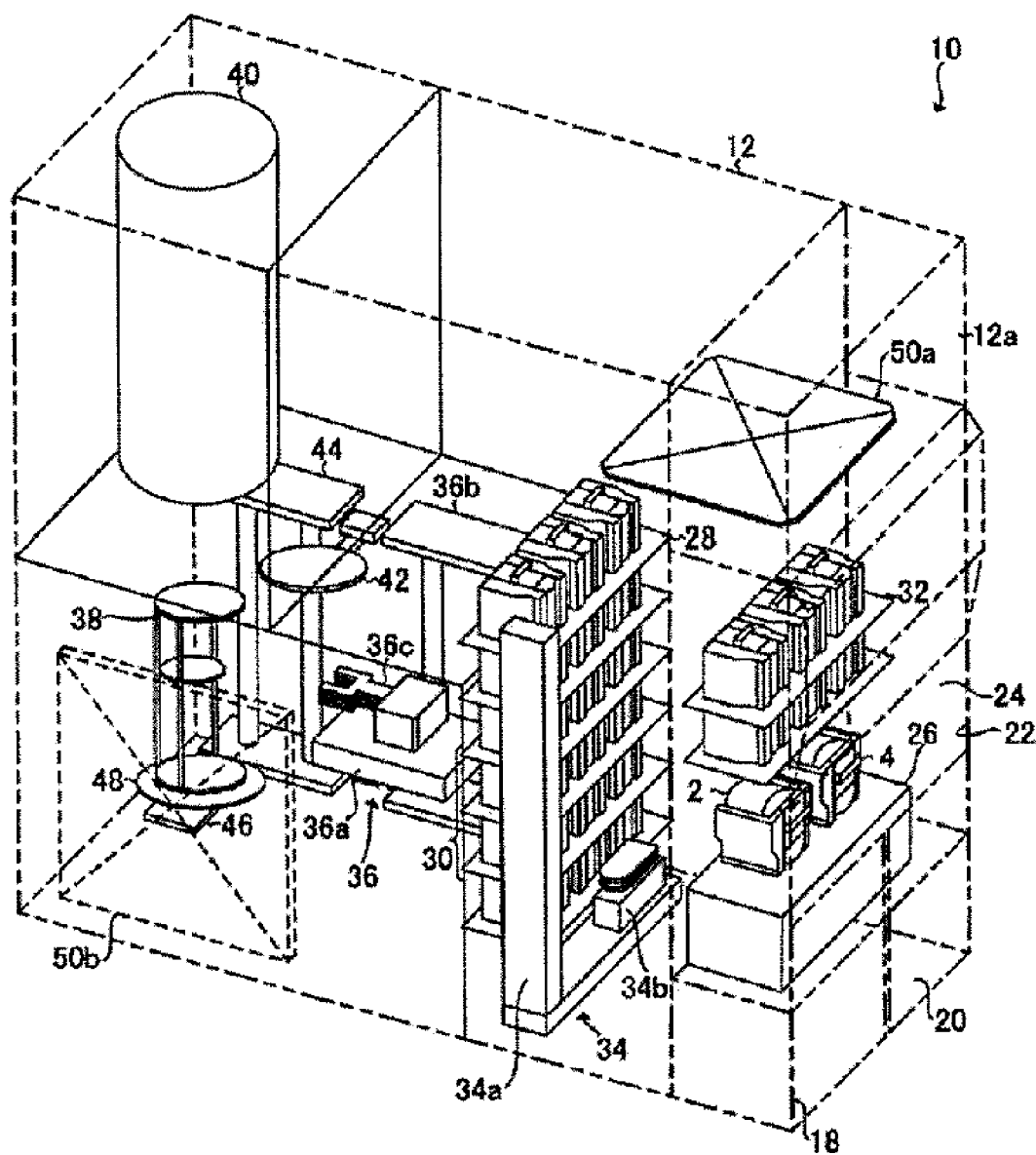
FIG. 1 is a perspective view of a film forming processing apparatus according to a first embodiment of the present disclosure.

FIG. 1 is a perspective view of a film forming processing apparatus 10 according to an embodiment of the present disclosure. Also, in the following description, a case where a batch type vertical apparatus is used as the film forming processing apparatus 10 will be described.

In the film forming processing apparatus 10, a cassette 4 is used as a wafer carrier that accommodates a wafer 2 which is a substrate made of silicon or the like.

The film forming processing apparatus 10 includes a housing 12. At a lower part of a front wall 12a of the housing 12, a front maintenance opening 18 is formed to allow maintenance. At the front maintenance opening 18, an openable/closable front maintenance door 20 is installed.

At the front maintenance door 20, a cassette loading/unloading opening 22 is formed to communicate with the interior and exterior of the housing 12. The cassette loading/unloading opening 22 is configured to be opened or closed by a front shutter 24.

A cassette stage 26 is installed inside the housing 12 facing the cassette loading/unloading opening 22. The cassette 4 is carried in onto the cassette stage 26 or is carried out from the cassette stage 26 by an in-plant carrying device (not shown).

The cassette 4 is loaded onto the cassette stage 26 by means of the in-plant carrying device. The wafer 2 is held in a vertical position inside the cassette 4, and a wafer charging/discharging opening of the cassette 4 faces upward. The cassette stage 26 is configured so that the cassette 4 is turned to the right toward the rear of the housing 12 and rotated 90 degrees clockwise, whereby the wafer 2 within the cassette 4 is set in a horizontal position and the wafer charging/discharging opening of the cassette 4 faces toward the rear of the housing 12.

At an approximately center lower part of the inside of the housing 12 in a front and rear direction, a cassette shelf 28 is installed. The cassette shelf 28 is configured such that a plurality of cassettes 4 are stored in multiple stages and in multiple rows. In the cassette shelf 28, a transfer shelf 30 accommodates the cassettes 4 that are transfer targets of a wafer transfer mechanism 36 to be described later. Above the cassette stage 26, a preliminary cassette shelf 32 can store preliminary cassettes 4.

A cassette carrier device 34 is located between the cassette stage 26 and the cassette shelf 28. The cassette carrier device 34 includes a cassette elevator 34a, which holds and elevates the cassettes 4, and a cassette carrying mechanism 34b as a carrying mechanism. The cassette carrier device 34 carries the cassettes 4 among the cassette stage 26, the cassette shelf 28, and the preliminary cassette shelf 32 through the operation of the cassette elevator 34a and the cassette carrier device 34b.

At the rear of the cassette shelf 28, a wafer transfer mechanism 36 is installed. The wafer transfer mechanism 36 includes a wafer transfer device 36a, which can rotate the wafer 2 in a horizontal direction or move the wafer 2 straight, and a wafer transfer device elevator 36b, which elevates the wafer transfer device 36a.

The wafer transfer device elevator 36b is installed at a right end of the housing 12. The wafer transfer mechanism 36 picks up the wafer 2, charges the wafer 2 into a boat 38 and discharges the wafer 2 from the boat 38 with tweezers 36c of the wafer transfer device 36a through operation of the wafer transfer device 36a and the wafer transfer device elevator 36b.

At the rear upper part of the housing 12, a processing furnace 40 is installed. A lower end of the process furnace 40 is configured to be opened or closed by a furnace throat shutter 42.

Below the processing furnace 40, a boat elevator 44 is installed to elevate the boat 38 to the processing furnace 40. An arm 46 as a connecting tool is connected to the boat elevator 44, and a seal cap 48 as a lid is horizontally installed on the arm 46.

The boat 38 has a plurality of holding members to horizontally hold a plurality of wafers 2 (for example, about 50 to 150 wafers) with their centers being aligned vertically.

The seal cap 48 is made of a metal, for example, a stainless steel, and is formed in a disk shape. The seal cap 48 vertically supports the boat 38 and is configured to close the lower end of the processing furnace 40.

Above the cassette shelf 28, a first clean unit 50a is installed to supply clean air, which is a cleaned atmosphere. The first clean unit 50a is provided with a supply fan and a dust-proof filter, so that clean air is circulated to the inside of the housing 12.

At the left end of the housing 12, which is the side opposite to the wafer transfer device elevator 36b and the boat elevator 44, a second clean unit 50b is installed to supply clean air. The second clean unit 50b also is provided with a supply fan and a dust-proof filter, like the first clean unit 50a. Clean air supplied from the second clean unit 50b is circulated to the vicinity of the wafer transfer device 36a, the boat 38, and the like, and then, is exhausted from an exhaust device (not shown) to the exterior of the housing 12.

Next, the operation of the film forming processing apparatus 10 will be described.

Prior to supplying the cassette 4 to the cassette stage 26, the cassette loading/unloading opening 22 is opened by the front shutter 24. Thereafter, the cassette 4 is loaded onto the cassette stage 26 through the cassette loading/unloading opening 22. At this time, the wafer 2 inside the cassette 4 is placed in a vertical position, and the wafer charging/discharging opening of the cassette 4 faces upward.

Thereafter, the cassette 4 is turned to the right and rotated at 90 degrees clockwise by the cassette stage 26, so that the wafer 2 within the cassette 4 is set in a horizontal position and the wafer charging/discharging opening of the cassette 4 faces toward the rear of the housing 12.

Next, the cassette 4 is automatically transferred to a designated shelf position of the cassette shelf 28 or the preliminary cassette shelf 32 by the cassette transfer device 34 to be temporarily stored therein, and is transferred from the cassette shelf 28 or the preliminary cassette shelf 32 to the transfer shelf 30 by the cassette transfer device 34, or is directly transferred to the transfer shelf 30.

When the cassette 4 is transferred to the transfer shelf 30, the wafer 2 is picked up from the cassette 4 through the wafer charging/discharging opening by the tweezers 36c of the wafer transfer device 36a, and is charged into the boat 38. The wafer transfer device 36a, which transfers the wafer 2 to the boat 38, is returned to the cassette 4 and charges a next wafer 2 into the boat 38.

When a previously designated number of wafers 2 are charged into the boat 38, the furnace throat shutter 42 is opened and the lower end part of the process furnace 40 is opened. Subsequently, the boat 38 holding a wafer 2 group is loaded into the processing furnace 40 by elevating the seal cap 48 by the boat elevator 44.

After loading, the wafer 2 is processed in the processing furnace 40. After processing, the cassette 4 and the wafer 2 are discharged outside the housing 12 in a reverse procedure to the above-described procedure.

Next, a peripheral structure of the processing furnace 40 will be described.

Figure 2:
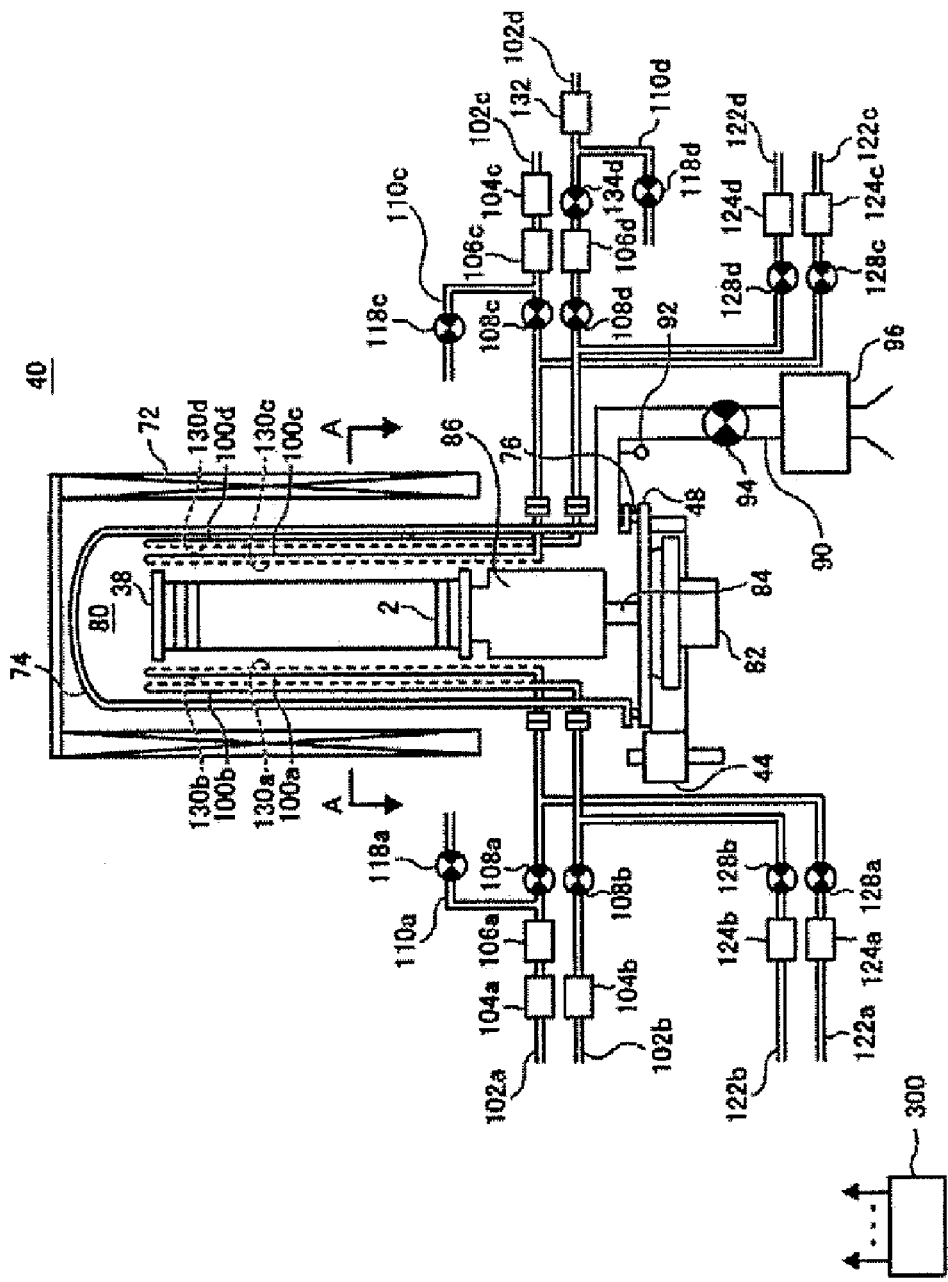
FIG. 2 is a schematic view of a processing furnace and a peripheral structure thereof according to the first embodiment of the present disclosure.
Figure 3:
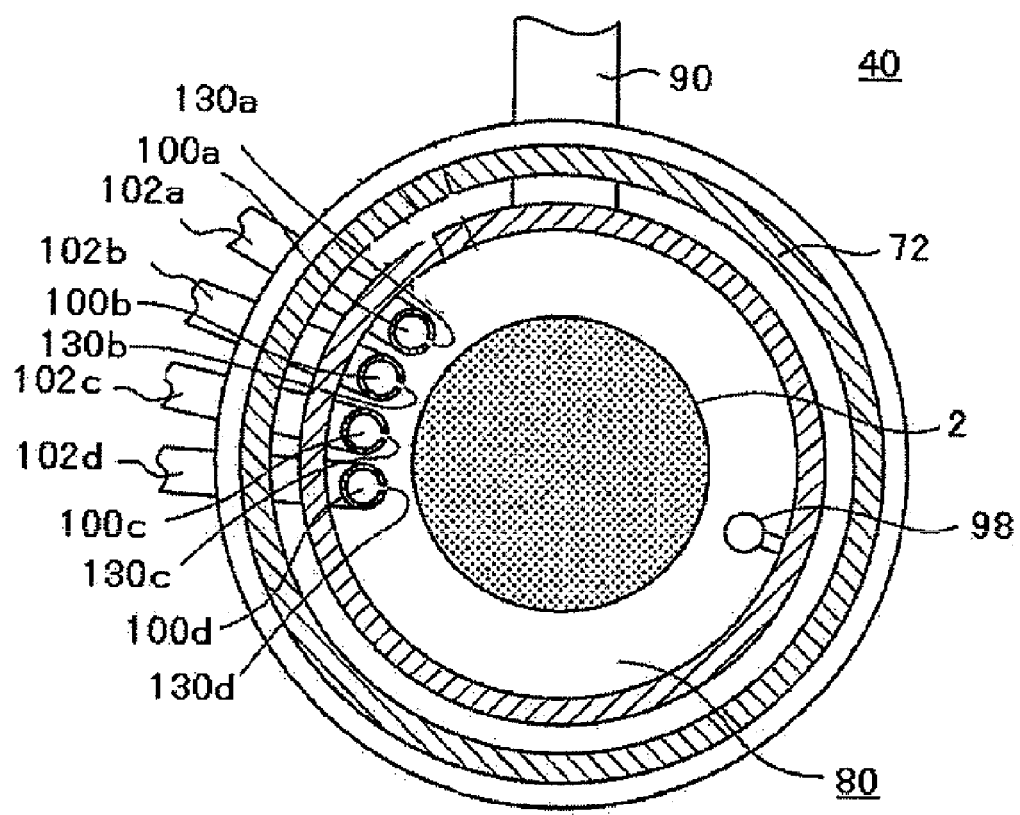
FIG. 3 is a cross-sectional view taken along line A-A of FIG. 2.

FIG. 2 is a schematic view of the processing furnace 40 and its peripheral structure. FIG. 3 is a sectional view taken along line A-A of FIG. 2.

The processing furnace 40 includes a heater 72 as a heating unit (heating mechanism).

The heater 72 has a cylindrical shape and is vertically installed by being supported by a heater base (not shown) as a holding plate. In the inside of the heater 72, a reaction tube 74 constituting a reaction vessel (processing vessel) is installed concentrically with the heater 72.

Below the reaction tube 74, a seal cap 48 is provided which can air-tightly close a lower end opening of the reaction tube 74. The seal cap 48 contacts the lower end part of the reaction tube 74. On the top surface of the seal cap 48, an O-ring 76 is installed as a seal member that contacts the lower end part of the reaction tube 74.

In the processing furnace 40, a processing chamber (film forming chamber) 80 is formed. The processing chamber 80 performs a film formation process with at least the reaction tube 74 and the seal cap 48.

A rotating mechanism 82 rotates the boat 38 located at an opposite side of the processing chamber as seal cap 48. A rotating shaft 84 of the rotating mechanism 82 passes through the seal cap 48 to be connected to the boat 38, and rotates the wafer 2 by rotating the boat 38.

As the seal cap 48 is elevated in a vertical direction by the boat elevator 44, the boat 38 is loaded into or unloaded from the processing chamber 80.

The boat 38 is erected on the seal cap 48 via a quartz cap 86 as a heat insulating member. The quartz cap 86 is made of a heat resistant material, for example, quartz or silicon carbide, and functions as a heat insulating unit and simultaneously as a holding body to hold the boat 38.

In the reaction tube 74, an exhaust pipe 90 is installed to exhaust atmosphere within the processing chamber 80. A vacuum pump 96 as a vacuum exhaust device is connected to the exhaust pipe 90. A pressure sensor 92, which is a pressure detector (pressure detecting unit) to detect pressure inside the processing chamber 80, and an Auto Pressure Controller (APC) valve 94, which is a pressure regulator (pressure regulating unit), are installed at the exhaust pipe 90. The vacuum pump 96 performs a vacuum exhaust such that pressure inside the processing chamber 80 is set to a predetermined pressure (vacuum degree).

In addition, the APC valve 94 is an on-off valve that can start or stop the vacuum exhaust inside the processing chamber 80 by opening or closing a valve, and also adjust the pressure by adjusting a valve opening degree.

Mainly, an exhaust system is configured by the exhaust pipe 90, the pressure sensor 92, the APC valve 94, and the vacuum pump 96.

In the reaction tube 74, a temperature sensor 98 is installed as a temperature detector. The temperature inside the processing chamber 80 is maintained at a desired temperature distribution by adjusting an on/off state of the heater 72, based on temperature information detected by the temperature sensor 98. The temperature sensor 98 is formed in an L shape and is installed along the inner wall of the reaction tube 74.

In the processing chamber 80, four nozzles 100a, 100b, 100c and 100d are installed to pass through the reaction tube 74 at the lower part thereof.

Gas supply pipes 102a, 102b, 102c and 102d are connected to the nozzles 100a, 100b, 100c and 100d, respectively.

As such, the four nozzles 100a to 100d and the four gas supply pipes 102a to 102d are installed in the reaction tube 74, and the processing chamber 80 is configured to supply a plurality of gases to the inside of the reaction tube 74.

At the gas supply pipe 102a, a mass flow controller (MFC) 104a that functions as a flow rate controller (flow rate control unit), a vaporizer 106 that functions as a vaporizing device (vaporizing unit) to vaporize liquid raw material and generate a vaporized gas as a raw material gas, and a valve 108a that functions as an on-off valve are installed in this order from an upstream direction.

By opening the valve 108a, the vaporized gas generated within the vaporizer 106a is supplied into the processing chamber 80 via the nozzle 100a.

A bent line 110a connected to the exhaust pipe 90 is connected between the vaporizer 106a of the gas supply pipe 102a and the valve 108a. A valve 118a being an on-off valve is installed in the bent line 110a. If the raw material gas is not supplied to the processing chamber 80, the raw material gas may be supplied to the bent line 110a via the valve 118a.

Therefore, by closing the valve 108a and opening the valve 118a, the supply of the vaporized gas into the processing chamber 80 can be stopped while continuing the generation of the vaporized gas in the vaporizer 106a.

A predetermined time is required to stably generate the vaporized gas, but, in the current embodiment, it is possible to switch between the supply and non-supply of the vaporized gas into the processing chamber 80 in a short time by the switching operation of the valve 108a and the valve 118a.

At the gas supply pipe 102a, an inert gas supply pipe 122a is connected to a downstream side of the valve 108a (a side close to the reaction tube 74). At the inert gas supply pipe 122a, an MFC 124a and a valve 128a being an on-off valve are installed in this order from an upstream direction.

The nozzle 100a is connected to a front end of the gas supply pipe 102a. The nozzle 100a is installed in an arc-shaped space between the inner wall of the reaction tube 74 and the wafer 2 to extend in an upward stacking direction of the wafer 2 along the inner wall of the reaction tube 74.

The nozzle 100a is configured with an L-shaped long nozzle. At the side of the nozzle 100a, a plurality of gas supply holes 130a through which gas is supplied are formed. The gas supply holes 130a are opened toward the center of the reaction tube 74.

The gas supply holes 130a are formed from the lower part to the upper part of the reaction tube 74. The openings of respective gas supply holes 130a have the same area and also are provided at the same opening pitch.

Mainly, a first gas supply system is configured by the gas supply pipe 102a, the bent line 110a, the MFC 104a, the vaporizer 106a, the valves 108a and 118a, and the nozzle 100a.

In addition, mainly, a first inert gas supply system is configured by the inert gas supply pipe 122a, the MFC 124a, and the valve 128a.

At the gas supply pipe 102b, an MFC 104b and a valve 108b being an on-off valve are installed in this order from an upstream direction.

At the gas supply pipe 102b, an inert gas supply pipe 122b is connected to a downstream side of the valve 108b (a side close to the reaction tube 74). At the inert gas supply pipe 122b, an MFC 124b and a valve 128b being an on-off valve are installed in this order from an upstream direction.

The nozzle 100b is connected to a front end of the gas supply pipe 102b. The nozzle 100b is installed in an arc-shaped space between the inner wall of the reaction tube 74 and the wafer 2 to extend in an upward stacked direction of the wafer 2 along the inner wall of the reaction tube 74 in.

The nozzle 100b is configured with an L-shaped long nozzle. At the side of the nozzle 100b, a plurality of gas supply holes 130b through which gas is supplied are formed, and the gas supply holes 130b are opened toward the center of the reaction tube 74.

The gas supply holes 130b are formed from the lower part to the upper part of the reaction tube 74. The openings of respective gas supply holes 130b have the same area and also are provided at the same opening pitch.

Mainly, a second gas supply system is configured by the gas supply pipe 102b, the MFC 104b, the valve 108b, and the nozzle 100b.

In addition, mainly, a second inert gas supply system is configured by the inert gas supply pipe 122b, the MFC 124b, and the valve 128b.

At the gas supply pipe 102c, an MFC 104c, a vaporizer 106c, and a valve 108c being an on-off valve are installed in this order from an upstream direction.

By opening the valve 108c, the vaporized gas generated within the vaporizer 106c is supplied into the processing chamber 80 via the nozzle 100c.

A bent line 110c connected to the exhaust pipe 90 is connected between the vaporizer 106c of the gas supply pipe 102c and the valve 108c. A valve 118c being an on-off valve is installed in the bent line 110c. If the raw material gas is not supplied to the processing chamber 80, the raw material gas may be supplied to the bent line 110c via the valve 118c.

Therefore, by closing the valve 108c and opening the valve 118a, the supply of the vaporized gas into the processing chamber 80 can be stopped while continuing the generation of the vaporized gas in the vaporizer 106c.

A predetermined time is required in some embodiments to stably generate the vaporized gas, but, in the current embodiment, it is possible to switch between the supply and non-supply of the vaporized gas into the processing chamber 80 in a short time by the switching operation of the valve 108a and the valve 118a.

At the gas supply pipe 102c, an inert gas supply pipe 122c is connected to a downstream side of the valve 108c. At the inert gas supply pipe 122c, an MFC 124c and a valve 128c being an on-off valve are installed in this order from an upstream direction.

The nozzle 100c is connected to a front end of the gas supply pipe 102c. The nozzle 100c is installed in an arc-shaped space between the inner wall of the reaction tube 74 and the wafer 2 to extend in an upward stacked direction of the wafer 2 along the inner wall of the reaction tube 74.

The nozzle 100c is configured with an L-shaped long nozzle. At the side of the nozzle 100c, a plurality of gas supply holes 130c through which gas is supplied are formed, and the gas supply holes 130c are opened toward the center of the reaction tube 74.

The gas supply holes 130c are formed from the lower part to the upper part of the reaction tube 74. The openings of respective gas supply holes 130c have the same area and also are provided at the same opening pitch.

Mainly, a third gas supply system is configured by the gas supply pipe 102c, the bent line 110c, the MFC 104c, the vaporizer 106c, the valves 108c and 118c, and the nozzle 100c.

In addition, mainly, a third inert gas supply system is configured by the inert gas supply pipe 122c, the MFC 124c, and the valve 128c.

At the gas supply pipe 102d, an ozonizer 132 being an ozone ($O_3$) gas generating apparatus, a valve 134d, an MFC 104d, a vaporizer 106d, and a valve 108d being an on-off valve are installed in this order from an upstream direction.

An upstream side of the gas supply pipe 102d is connected to an oxygen gas supply source (not shown) that supplies oxygen ($O_2$) gas. $O_2$ gas supplied to the ozonizer 132 is changed to $O_3$ gas in the ozonizer, and the $O_3$ gas is supplied into the processing chamber 80.

A bent line 110d connected to the exhaust pipe 90 is connected between the ozonizer 132 of the gas supply pipe 102d and the valve 134d. At the bent line 110d, a valve 118d being an on-off valve is installed. If $O_3$ gas is not supplied into the processing chamber 80, $O_3$ gas may be supplied to the bent line 110d via the valve 118d.

Therefore, by closing the valve 108d and opening the valve 134d, the supply of $O_3$ gas into the processing chamber 80 can be stopped while continuing the generation of $O_3$ gas in the ozonizer 132.

A predetermined time is required in some embodiments to stably generate $O_3$ gas, but, in the current embodiment, it is possible to switch between the supply and non-supply of the $O_3$ gas into the processing chamber 80 in a short time by the switching operation of the valve 108d, the valve 134d, and the valve 118d.

At the gas supply pipe 102d, an inert gas supply pipe 122d is connected to a downstream side of the valve 108d. At the inert gas supply pipe 122d, an MFC 124d and a valve 128d being an on-off valve are installed in this order from an upstream direction.

The nozzle 100d is connected to a front end of the gas supply pipe 102d. The nozzle 100d is installed in an arc-shaped space between the inner wall of the reaction tube 74 and the wafer 2 to extend in an upward stacked direction of the wafer 2 along the inner wall of the reaction tube 74.

The nozzle 100d is configured with an L-shaped long nozzle. At the side of the nozzle 100d, a plurality of gas supply holes 130d through which gas is supplied are formed, and the gas supply holes 130d are opened toward the center of the reaction tube 74.

The gas supply holes 130d are formed from the lower part to the upper part of the reaction tube 74. The openings of respective gas supply holes 130d have the same area and also are provided at the same opening pitch.

Mainly, a fourth gas supply system is configured by the gas supply pipe 102d, the bent line 110d, the MFC 104d, the ozonizer 132, the valves 108d, 134d and 118d, and the nozzle 100d.

In addition, mainly, a fourth inert gas supply system is configured by the inert gas supply pipe 122d, the MFC 124d, and the valve 128d.

From the gas supply pipe 102a, a titanium raw material gas, i.e., a titanium (Ti) containing gas (titanium containing gas), as an example of a first raw material gas (processing gas) is supplied into the processing chamber 80 via the MFC 104a, the vaporizer 106a, the valve 108a, and the nozzle 100a.

As the titanium containing gas, titanium tetrachloride ($TiCl_4$) may be used.

The first raw material gas (first raw material) may be any one of solid, liquid, and gas at ordinary temperature and pressure. However, in the current embodiment, the case where the first raw material is a liquid will be described. In the case where the first raw material is a gas at an ordinary temperature and pressure, the vaporizer 106a may be omitted.

From the gas supply pipe 102b, a nitrogen (N) containing processing gas (nitrogen containing gas) as a nitriding gas (nitriding agent) is supplied into the processing chamber 80 via the MFC 104b, the valve 108b, and the nozzle 100b.

As the nitrogen containing gas, ammonia ($NH_3$) gas, nitrogen ($N_2$) gas, nitrogen trifluoride ($NF_3$), or $N_3H_8$ gas may be used.

From the gas supply pipe 102c, zirconium raw material gas, i.e., zirconium (Zr) containing gas (zirconium containing gas) as the second raw material gas (processing gas) is supplied into the processing chamber 80 via the MFC 104c, the vaporizer 106c, the valve 108c, and the nozzle 100c.

As the zirconium containing gas, tetrakis(ethylmethylamino)zirconium (TEMAZ:$Zr(N(CH_3)C_2H_5)_4$ may be used.

The second raw material gas (second raw material) may be any one of solid, liquid, and gas at ordinary temperature and pressure. However, in the current embodiment, the case where the second raw material is the liquid will be described. In the case where the second raw material is the gas at an ordinary temperature and pressure, the vaporizer 106c may be omitted.

From the gas supply pipe 102d, $O_3$ gas as an oxidizing gas (oxidizing agent) is supplied into the processing chamber 80 via the valve 134d, the MFC 104d, and the valve 108d. $O_3$ gas is generated by supplying oxygen (O) containing processing gas (oxygen containing gas) to the ozonizer 132. The oxygen containing gas may use $O_2$ gas.

In addition, $O_2$ gas as the oxidizing gas can be supplied into the processing chamber 80, without generating $O_3$ gas in the ozonizer 132.

From the inert gas supply pipes 122a to 122d, nitrogen ($N_2$) gas as an inert gas is supplied into the processing chamber 80 via the corresponding MFC 124a to 124d, valves 128a to 128d, gas supply pipes 102a to 102d, and the nozzles 100a to 100d.

In addition to $N_2$ gas, a noble gas such as argon (Ar) gas, helium (He) gas, neon (Ne) gas, and xenon (Xe) gas may be used as the inert gas.

<Structure of Reforming Processing Apparatus>

Next, a reforming processing apparatus 200 will be described.

Figure 4:
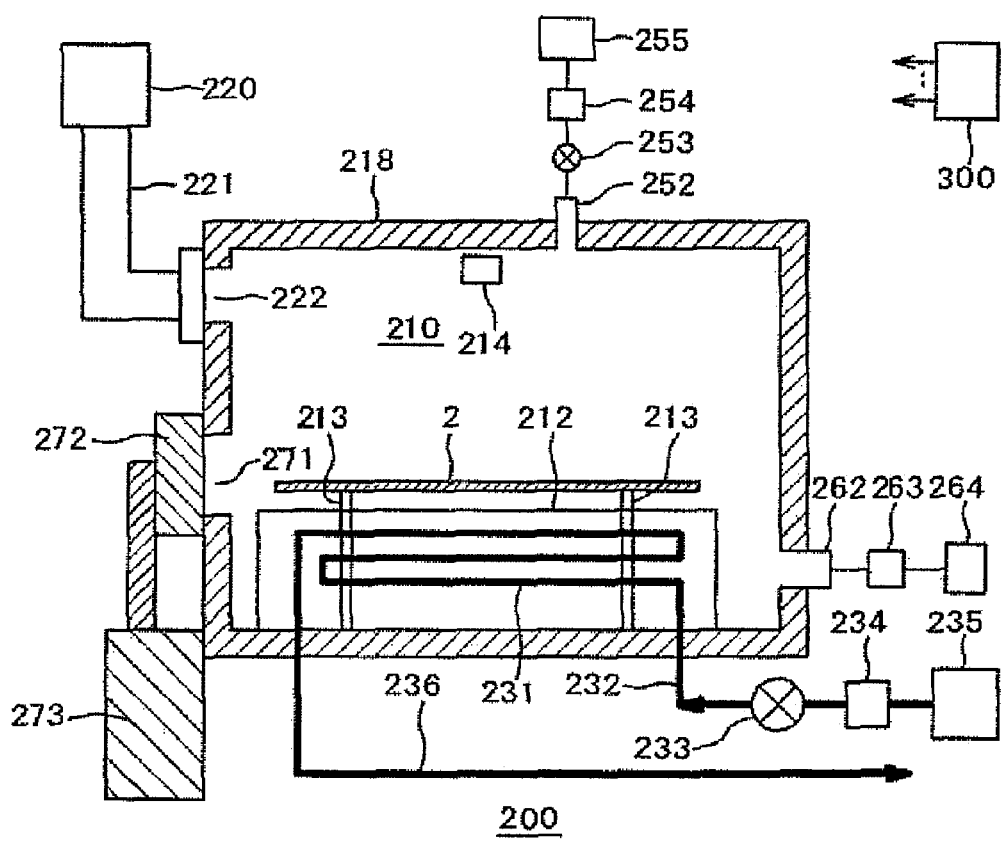
FIG. 4 is a vertical sectional view of a reforming processing apparatus according to the first embodiment of the present disclosure.

FIG. 4 is a vertical sectional view of the reforming processing apparatus 200 according to an embodiment of the present disclosure. The reforming processing apparatus 200 includes a processing chamber (reforming chamber) 210, a transfer chamber (not shown), and a microwave supply unit (microwave generating apparatus, a microwave generator). The processing chamber 210 reforms the wafer 2. The microwave supply unit includes a microwave generating unit 220, a waveguide 221, and a waveguide opening 222.

The microwave generating unit 220 generates, for example, a fixed frequency microwave or a variable frequency microwave. The microwave generating unit 220 uses, for example, a magnetron, a klystron, or a gyrotron. The microwave generated in the microwave generating unit 220 is introduced into the processing chamber 210 from the waveguide opening 222 communicating with the processing chamber 210 via the wave guide 221. In addition, in FIG. 4, although the microwave is introduced horizontally to the wafer 2 from a lateral direction, it is not limited thereto. For example, the microwave may be introduced from the upper part of the processing chamber 210 in a vertical direction with respect to the wafer 2. In addition, there may be a plurality of waveguides 221, and the microwave may be introduced from the plurality of waveguides 221 to the processing chamber 210.

The microwave introduced into the processing chamber 210 is repeatedly reflected off the walls of the processing chamber 210. The microwave is reflected in various directions within the processing chamber 210, so the inside of the processing chamber 210 is filled with the microwaves. The microwave contacting the wafer 2 within the processing chamber 210 is absorbed into the wafer 2, and the wafer 2 is dielectric-heated by the microwave.

In addition, the microwave is a generic term for electromagnetic waves having a frequency band of about 300 MHz to about 300 GHz. In terms of wavelength in a vacuum, the microwave is an electromagnetic wave having a wavelength of about 1 m to about 1 mm. This microwave includes a millimeter wave of about 30 GHz to about 300 GHz.

Figure 5:
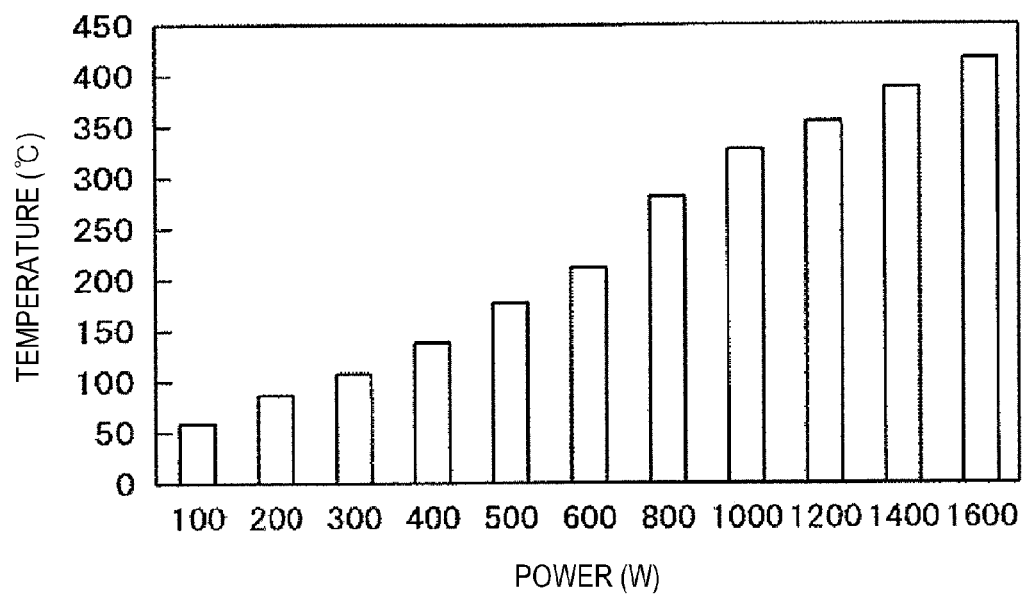
FIG. 5 is a diagram illustrating an example of a correlation between a microwave power and a substrate temperature.

The temperature of the wafer 2 is low when microwave power is low, and is high when microwave power is high. FIG. 5 illustrates correlation data of the microwave power and the wafer temperature when a microwave is irradiated on a silicon wafer. FIG. 5 is a diagram illustrating an example of the correlation of the microwave power and the wafer temperature. As illustrated in FIG. 5, the wafer temperature rises as the microwave power increases.

In addition, the wafer temperature changes depending on the size or shape of the processing chamber, the position of the waveguide of the microwave, and the position of the wafer. The wafer temperature value of the data herein is exemplary. However, the correlation that the wafer temperature increases as the microwave power increases is unchanging.

The processing vessel 218 forming the processing chamber 210 is made of, for example, a metallic material such as aluminum (Al) and stainless steel (SUS), and the processing chamber 210 is microwave-shielded from the exterior.

In the processing chamber 210, a substrate support pin 213 is installed as a substrate support unit that supports the wafer 2. The substrate support pin 213 is installed such that the center of the supported wafer 2 and the center of the processing chamber 210 are approximately aligned with each other in a vertical direction. The substrate support pin 213 is configured with a plurality of support pins (in the current embodiment, three support pins) composed of, for example, quartz or Teflon (trademark), and the upper end part thereof supports the wafer 2.

Below the wafer 2, a conductive substrate support table (substrate holding table) 212 being a substrate temperature control unit (including a temperature control mechanism) is installed. The substrate support table 212 is made of, for example, a metallic material being a conductor such as aluminum (Al) or the like. The substrate support table 212 has a circular shape whose outer diameter is larger than that of the wafer 2, when viewed from above the top surface, and is formed in a disk shape or a cylindrical shape.

Since the substrate support table 212 is made of a metallic material, the potential of the microwave becomes zero in the substrate support table 212. Therefore, if the wafer 2 is directly placed on the surface of the substrate support table 212, the electric field intensity of the microwave becomes weak. Therefore, in the current embodiment, the wafer 2 is placed at a position of quarter wavelength ($\lambda/4$) of the microwave from the substrate support table 212, or a position of an odd multiple of $\lambda/4$. Since the electric field is strong at the position of the odd multiple of $\lambda/4$, the wafer 2 can be efficiently heated by the microwave.

In the current embodiment, for example, 5.8 GHz microwave is used. Since the wavelength of the microwave is 51.7 mm, the height from the substrate support table 212 to the wafer 2 is set to 12.9 mm.

In the inside of the substrate support table 212, a coolant passage 231 through which coolant flows so as to cool the wafer 2 is formed. In the current embodiment, water is used as the coolant, and other coolant such as a cooling chiller may also be used. The coolant passage 231 is connected to a coolant supply pipe 232, which supplies the coolant from the exterior of the processing chamber 210 to the coolant passage 231, and a coolant discharge pipe 236, which discharges the coolant from the coolant passage 231. At the coolant supply pipe 232, an on-off valve 233 opening/closing the coolant supply pipe 232, a flow rate control device 234 controlling a coolant flow rate, and a coolant source 35 are installed in this order from a downstream. The on-off valve 233 and the flow rate control device 234 are electrically connected to a controller 300 to be described later, and are controlled by the controller 300.

Above the wafer 2, a temperature detector 214 detecting the temperature of the wafer 2 and a temperature control mechanism (not shown) are installed in the processing chamber 210. The temperature detector 214 may use, for example, an infrared sensor. The temperature detector 214 is electrically connected to the controller 300. If the temperature of the wafer 2 detected by the temperature detector 214 is higher than a predetermined temperature, the controller 300 adjusts a flow rate of the cooling water flowing through the coolant passage 231 by controlling the on-off valve 233 and the flow rate control device 234 so that the temperature of the wafer 2 becomes the predetermined temperature. On the contrary, if the temperature of the wafer 2 is lower than the predetermined temperature, the wafer 2 may be heated by the temperature control mechanism so as to improve the effect of the reforming processing.

Above the processing vessel 218, a gas supply pipe 252 through which nitrogen ($N_2$) gas or the like is introduced is installed at the top wall of the processing chamber 210. At the gas supply pipe 252, a gas supply source 255, a flow rate control device 254 adjusting a gas flow rate, and a valve 253 opening/closing a gas passage are installed in this order from an upstream. By opening/closing this valve 253, gas is introduced from the gas supply pipe 252 into the processing chamber 210 or the introduction of gas is stopped. The gas introduced from the gas supply pipe 252 is used to cool the wafer 2 or is used as a purge gas to extrude gas inside the processing chamber 210. At the gas supply pipe 252, a diffuser for diffusing gas uniformly may be installed.

A gas supply unit is configured by the gas supply source 255, the gas supply pipe 252, the flow rate control device 254, and the valve 253. The flow rate control device 254 and the valve 253 are electrically connected to the controller 300 and are controlled by the controller 300.

As illustrated in FIG. 4, for example, in the lower part of the rectangular parallelepiped processing vessel 218, a gas exhaust pipe 262 is installed at the sidewall of the processing chamber 210 to exhaust gas inside the processing chamber 210. At the gas exhaust pipe 262, a pressure regulating valve 263 and a vacuum pump 264 being an exhaust device are installed in this order from an upstream, and the pressure inside the processing chamber 210 is regulated to a predetermined value by adjusting the opening degree of the pressure regulating valve 263.

A gas exhaust unit is configured by the gas exhaust pipe 262, the pressure regulating valve 263, and the vacuum pump 264. The pressure regulating valve 263 and the vacuum pump 264 are electrically connected to the controller 300 and the pressure regulation is controlled by the controller 300.

As illustrated in FIG. 4, at one side of the processing vessel 218, a wafer transfer opening 271 through which the wafer 2 is transferred to the inside and outside of the processing chamber 210 is installed. At the wafer transfer opening 271, a gate valve 272 is installed. When the gate valve 272 is opened by a gate valve driving unit 273, the inside of the processing chamber 210 and the inside of the transfer chamber communicate with each other.

In the inside of the transfer chamber, a transfer robot (not shown) for transferring the wafer 2 is installed. At the transfer robot, a transfer arm is provided to support the wafer 2 when the wafer 2 is transferred. By opening the gate valve 272, the wafer 2 can be transferred between the inside of the processing chamber 210 and the inside of the transfer chamber by the transfer robot.

<Structure of Controller>

At the substrate processing apparatus system, the controller 300 being a control unit (control means) is installed, and the controller 300 controls operations of the respective components of the film forming processing apparatus 10 and the reforming processing apparatus 200.

To be specific, as for the film forming processing apparatus 10, the controller 300 is connected to the MFCs 104a to 104d and 124a to 124d, the valves 108a to 108d, 128a to 128d, 118a, 118c, 118d and 134d, the vaporizers 106a, 106c and 106d, the ozonizer 132, the pressure sensor 92, the APC valve 94, the heater 72, the temperature sensor 98, the vacuum pump 96, the rotating mechanism 82, the boat elevator 44, and so on.

The controller 300 controls the flow rate control operation of various gases by the MFCs 104a to 104d and 124a to 124d, the opening/closing operation of the valves 108a to 108d, 128a to 128d, 118a, 118c, 118d and 134d, the operation of the vaporizers 106a, 106c and 106d and the ozonizer 132, the pressure regulating operation based on the pressure sensor 92 and the opening/closing of the APC valve 94, the temperature regulating operation of the heater 72 based on the temperature sensor 98, the start and stop of the vacuum pump 96, the rotating speed regulating operation of the rotating mechanism 82, and the elevating operation of the boat elevator 44.

As for the reforming processing apparatus 200, the controller 300 controls the operations of the respective components of the microwave generating unit 220, the gate valve driving unit 273, the transfer robot, the flow rate control devices 254 and 234, the valves 253 and 233, the pressure regulating valve 263, and so on.

At the film forming processing apparatus 10 and the reforming processing apparatus 200, respective controller for controlling the respective units constituting the respective apparatuses may be installed.

<Processing Operation>

Next, as one of a plurality of processes for manufacturing a semiconductor apparatus (semiconductor device) using the substrate processing apparatus system, a processing operation for performing a film forming process and a reforming process on the wafer 2 will be described.

The processing operation will be schematically described.

In a conventional film forming method, a CVD method simultaneously supplies a plurality of kinds of gases containing a plurality of elements constituting a film to be formed. Also, an ALD method alternately supplies a plurality of kinds of gases containing a plurality of elements constituting a film to be formed.

By controlling supply conditions such as a gas supply flow rate, a gas supply time, a plasma power, and so on, when supplying the gas, a silicon nitride film (SiN film) or a silicon oxide film (SiO film) is formed.

In these film forming methods, for example, in the case of forming a SiN film, supply conditions are controlled so that a film composition ratio has a stoichiometric composition of $N/Si \approx 1.33$ and, in the case of forming a SiO film, supply conditions are controlled so that a film composition ratio has a stoichiometric composition of $O/Si \approx 2$.

Meanwhile, supply conditions may be controlled so that a composition ratio of a film to be formed has a predetermined composition ratio different from a stoichiometric composition. That is, supply conditions may be controlled so that at least one element of a plurality of elements constituting a film to be formed becomes more excessive than other elements with respect to a stoichiometric composition.

As such, a film formation may be performed while controlling a ratio (film composition ratio) of a plurality of elements constituting a film to be formed.

In addition, the term "metal film" refers to a film made of a conductive material containing a metal element. In addition to a conductive metal single body film made of a metal single body, the metal film includes a conductive metal nitride film, a conductive metal oxide film, a conductive metal oxynitride film, a conductive metal complex film, a conductive metal alloy film, a conductive metal silicide film, and so on.

For example, a titanium nitride film is a conductive metal nitride film.

The following description will be given on a sequence example of laminating two kinds of films having stoichiometric compositions by alternately supplying a plurality of kinds of gases containing different kinds of elements and reforming the laminated film.

In the current embodiment, the film forming processing apparatus 10 forms a laminated film of a metal nitride film and an insulating film by forming a titanium nitride film (TiN film) being a metal nitride film on a substrate (a metal film forming process), and forming a zirconium oxide film (ZrO film) being an insulating film (an insulating film forming process). The zirconium oxide film being a capacitor insulating film is laminated on the titanium nitride film being a bottom electrode on the substrate. The following description will be given on an example in which the substrate where the laminated film is formed is introduced into the reforming processing apparatus 200 and a crystal growth of a thin film is performed by reforming the laminated film using a microwave (reforming process).

In the following description, the operations of the respective units constituting the substrate processing apparatus system are controlled by the controller 300.

<Film Forming Process>

First, a film forming operation (S10) by the film forming processing apparatus 10 of the substrate processing apparatus system will be described.

Figure 6:
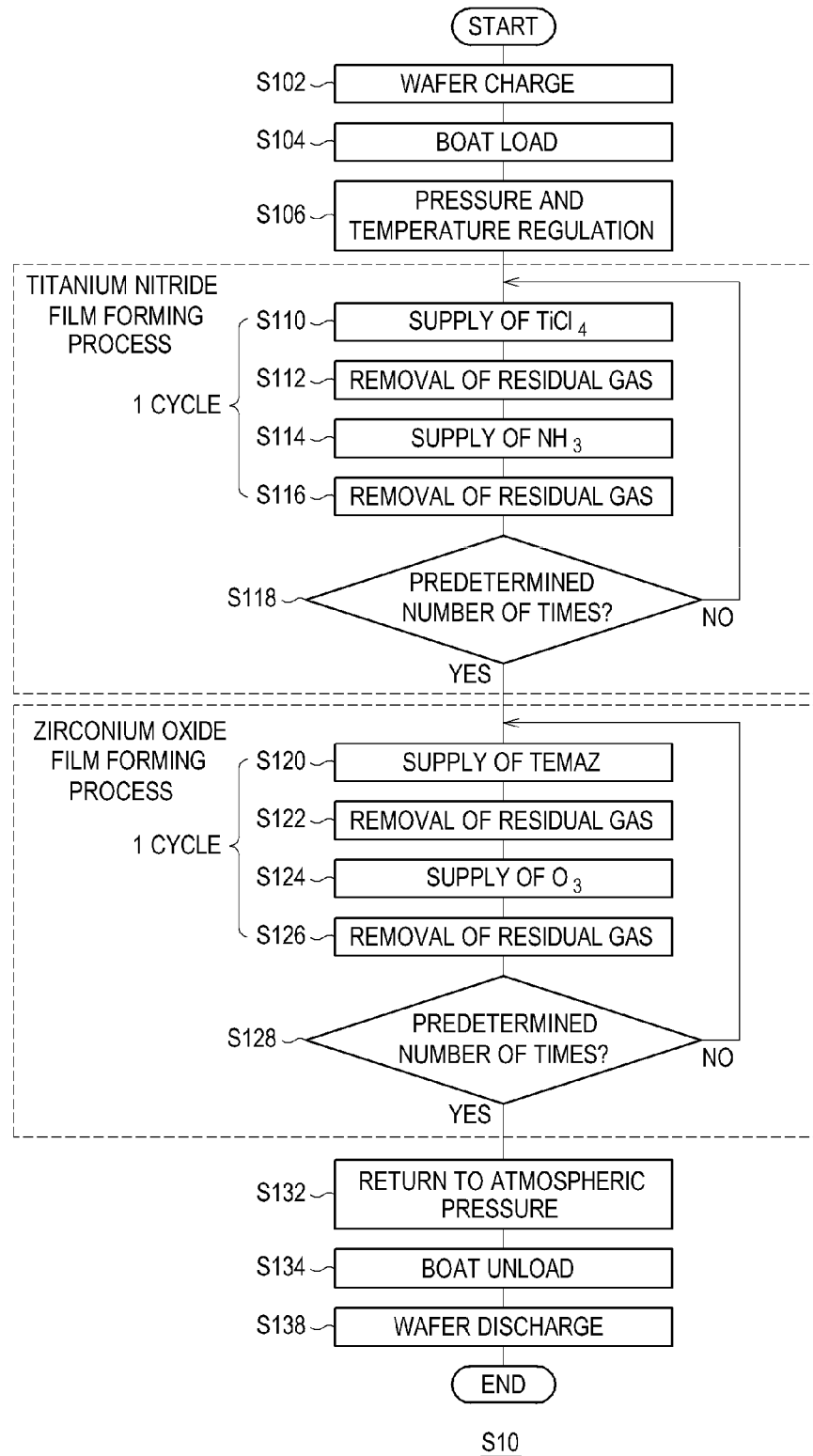
FIG. 6 is a flowchart of a film forming operation of the film forming processing apparatus according to the first embodiment of the present disclosure.

FIG. 6 is a flowchart of the film forming operation (S10) by the film forming processing apparatus 10.

Figure 7:
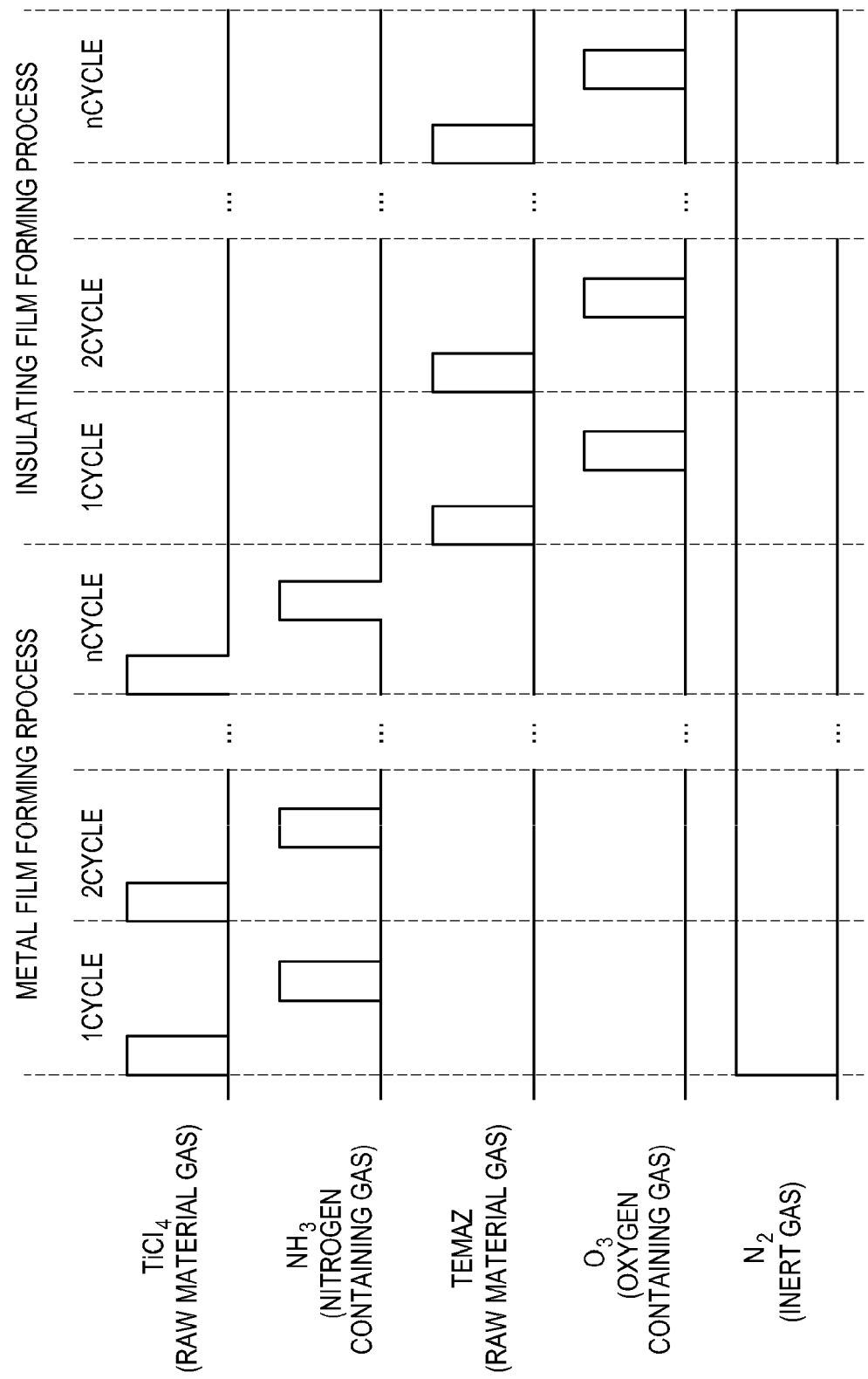
FIG. 7 is a diagram illustrating gas supply timing in a film forming operation.

FIG. 7 illustrates a gas supply timing in the film forming operation (S10).

In the current embodiment, $TiCl_4$ gas being a titanium (Ti) containing gas is used as a first raw material gas, $NH_3$ gas being a nitrogen containing gas is used as a nitriding gas, TEMAZ gas being a zirconium (Zr) containing gas and an organic metal raw material gas is used as a second raw material gas, and $O_3$ gas being an oxygen (O) containing gas is used as an oxidizing gas.

In addition, $N_2$ gas is used as an inert gas.

(Loading Process)

(Step 102)

First, a plurality of wafer 2 are charged into the boat 38 (wafer charging).

(Step 104)

The boat 38 holding the plurality of wafers 2 is lifted by the boat elevator 44 and is loaded into the processing chamber 80 (boat loading).

In this state, the seal cap 48 seals the bottom part of the reaction tube 74 via the O-ring 76.

(Step 106)

The inside of the processing chamber 80 is evacuated by the vacuum pump 96 such that it is set to a desired pressure (vacuum degree). At this time, the pressure inside the processing chamber 80 is measured by the pressure sensor 92, and the APC valve 94 is feedback controlled based on the measured pressure (pressure regulation).

In addition, the inside of the processing chamber 80 is heated by the heater 72 such that it is set to a desired temperature. At this time, the electrified state of the heater 72 is feedback controlled based on temperature information detected by the temperature sensor 98, such that the inside of the processing chamber 80 is set to a desired temperature distribution (temperature regulation).

Continuously, as the boat 38 is rotated by the rotating mechanism 82, the wafer 2 is rotated.

(Metal Film Forming Process)

Next, a metal film forming process of forming a titanium nitride film being a metal film is performed by supplying $TiCl_4$ gas and $NH_3$ gas into the processing chamber 80. In the metal film forming process, the following four steps are sequentially performed.

(Step 110)

In step 110, $TiCl_4$ gas as the first raw material gas is supplied into the processing chamber 80 (first process).

By opening the valve 108a of the gas supply pipe 102a and closing the valve 118a of the bent line 110a, $TiCl_4$ is flowed into the gas supply pipe 102a through the vaporizer 106a. The flow rate of the $TiCl_4$ gas flowed through the gas supply pipe 102a is controlled by the MFC 104a.

The flow-rate-controlled $TiCl_4$ gas is supplied from the gas supply holes 130a of the nozzle 100a to the inside of the processing chamber 80 and is exhausted from the exhaust pipe 90.

At this time, the valve 128a is opened to make $N_2$ gas flow through the inert gas supply pipe 122a. The flow rate of the $N_2$ gas flowing through the inert gas supply pipe 122a is controlled by the MFC 124a. The flow-rate-controlled $N_2$ gas is joined with the $TiCl_4$ gas to be supplied into the processing chamber 80 and exhausted from the exhaust pipe 90.

At this time, the pressure inside the processing chamber 80 is set to a range of, for example, 40 to 900 Pa by appropriately adjusting the APC valve 94.

The supply flow rate of the $TiCl_4$ gas controlled by the MFC 104a is set to a range of, for example, 0.05 to 0.3 g/min.

Time of exposure of the wafer 2 to the $TiCl_4$ gas, i.e., gas supply time (irradiation time) is set to a range of, for example, 15 to 120 seconds.

The temperature of the heater 72 is set such that the temperature of the wafer 2 (film forming processing temperature) is set to a range of, for example, 300 to 550° C.

By the supply of the $TiCl_4$ gas, a first layer containing titanium is formed on a base film of the surface of the wafer 2. That is, a titanium layer (Ti layer) as a titanium containing layer of less than 1 atomic layer to several atomic layers is formed on the wafer 2 (base film). The titanium containing layer may be a chemical adsorption (surface adsorption) layer of $TiCl_4$. In addition, titanium is an element that becomes solid by itself.

As well as a continuous layer configured by titanium, the titanium layer may also include a discontinuous layer or a laminated layer thereof. In some cases, the continuous layer configured by titanium is referred to as a "thin film".

In addition, the chemical adsorption layer of $TiCl_4$ includes a discontinuous chemical adsorption layer, as well as a continuous chemical adsorption layer of $TiCl_4$ molecule.

If the thickness of the titanium containing layer formed on the wafer 2 exceeds several atomic layers, a nitride operation in step 114 does not influence the entire titanium containing layer. In addition, the minimum value of the titanium containing layer that can be formed on the wafer 2 is less than 1 atomic layer.

Therefore, it is preferable that the thickness of the titanium containing layer is in a range from less than 1 atomic layer to several atomic layers.

By adjusting conditions such as the film forming processing temperature and the pressure inside the processing chamber 80, the state of the layer formed on the wafer 2 can be adjusted.

To be specific, if $TiCl_4$ gas is on a self-decomposition condition, titanium is deposited on the wafer 2 to form a titanium layer. Meanwhile, if $TiCl_4$ gas is not on the self-decomposition condition, $TiCl_4$ is chemically adsorbed on the wafer 2 to form a chemical adsorption layer of $TiCl_4$ gas.

In a case of forming the titanium layer on the wafer 2, a film forming rate (film forming speed) can be increased as compared to a case of forming a chemical adsorption layer of $TiCl_4$ on the wafer 2.

In addition, in a case of forming the titanium layer on the wafer 2, a denser layer can be formed as compared to a case of forming a chemical adsorption layer of $TiCl_4$ on the wafer 2.

(Step 112)

In step 112, gas remaining within the processing chamber 80 is removed (second process).

After forming the titanium containing layer, the valve 108a is closed and the valve 118a is opened, so that the supply of $TiCl_4$ gas into the processing chamber is stopped and $TiCl_4$ gas is made to flow into the bent line 110a.

At this time, the APC valve 94 of the exhaust pipe 90 remains opened and the inside of the processing chamber 80 is evacuated by the vacuum pump 96. Thus, unreacted $TiCl_4$ gas remaining within the processing chamber 80 or $TiCl_4$ gas after contribution to the formation of the titanium containing layer is removed from the processing chamber 80. At this time, the valve 128a remains opened and the supply of $N_2$ gas into the processing chamber 80 is maintained.

This improves the effect that unreacted $TiCl_4$ gas remaining within the processing chamber 80 or $TiCl_4$ gas after contribution to the formation of the titanium containing layer is removed from the processing chamber 80.

(Step 114)

In step 114, $NH_3$ gas as a nitriding gas is supplied into the processing chamber 80 (third process). After removing a residual gas within the processing chamber 80, the valve 118b of the gas supply pipe 102b is opened so that $NH_3$ gas is flowed into the gas supply pipe 102b.

The flow rate of the $NH_3$ gas flowed into the gas supply pipe 102b is controlled by the MFC 104b. The flow-rate-controlled $NH_3$ gas is supplied from the gas supply holes 130b to the inside of the processing chamber 80 and is exhausted from the exhaust pipe 90.

At this time, the valve 128b is opened so that $N_2$ gas is flowed into the insert gas supply pipe 122b. The flow rate of the $N_2$ gas flowed into the inert gas supply pipe 122b is controlled by the MFC 124b. The flow-rate-controlled $N_2$ gas is joined with the $NH_3$ gas to be supplied into the processing chamber 80 and exhausted from the exhaust pipe 90.

When the NH$_3$ gas is flowed, the pressure inside the processing chamber 80 is set to a range of, for example, 40 to 900 Pa.

The supply flow rate of the NH$_3$ gas controlled by the MFC 104b is set to a range of, for example, 6 to 15 slm.

Time of exposure of the wafer 2 to the NH$_3$ gas, i.e., a gas supply time (irradiation time), is set to a range of, for example, 15 to 120 seconds.

The temperature of the heater 72, like step 110, is set such that the temperature of the wafer 2 is set to a range of, for example, 300 to 550° C.

At this time, the gas supplied into the processing chamber 80 is NH$_3$ gas, and TiCl$_4$ gas is not supplied into the processing chamber 80. Therefore, NH$_3$ gas does not make a vapor phase reaction and reacts with a part of the titanium containing layer being a first layer formed on the wafer 2 in step 110.

Hence, the titanium containing layer is nitrided to form a second layer containing titanium and nitrogen, i.e., a titanium nitride layer (TiN layer).
(Step 116)

In step 116, gas remaining within the processing chamber 80 is removed (fourth process).

By closing the valve 108b of the gas supply pipe 102b, the supply of the NH$_3$ gas is stopped.

At this time, the APC valve 94 of the exhaust pipe 90 remains opened and the inside of the processing chamber 80 is evacuated by the vacuum pump 96. Thus, unreacted NH$_3$ gas remaining within the processing chamber 80 or NH$_3$ gas after contribution to the nitriding is removed from the processing chamber 80. At this time, the valve 128b remains opened and the supply of N$_2$ gas into the processing chamber 80 is maintained.

This improves the effect that unreacted NH$_3$ gas remaining within the processing chamber 80 or NH$_3$ gas after contribution to the nitriding is removed from the processing chamber 80.
(Step 118)

In step 118, steps 110 to 116 are set as 1 cycle, and it is determined whether the cycle is performed predetermined number of times. If the cycle is performed the predetermined number of times, the process proceeds to step 120 and, if not, the process proceeds to step 110.

As such, by performing the cycle of steps 110 to 116 at least one time, the titanium nitride film containing titanium and nitrogen may be formed to a predetermined thickness.

It is preferable that the cycle of steps 110 to 116 is repeated for plural times.
(Insulating Film Forming Process)

Next, an insulating film forming process of forming a zirconium oxide film being an insulating film is performed by supplying TEMAZ gas and O$_3$ gas into the processing chamber 80. In the insulating film forming process, the following four steps are sequentially performed.
(Step 120)

In step 120, TEMAZ gas as a second raw material is supplied into the processing chamber 80 (fifth process).

By opening the valve 108c of the gas supply pipe 102c and closing the valve 108c of the bent line 110c, TEMAZ gas is flowed into the gas supply pipe 102c through the evaporator 106c.

The flow rate of the TEMAZ gas flowed into the gas supply pipe 102c is controlled by the MFC 104c. The flow-rate-controlled TEMAZ gas is supplied from the gas supply holes 130c to the inside of the processing chamber 80 and is exhausted from the exhaust pipe 90.

At this time, the valve 128c is opened so that N$_2$ gas is flowed into the inert gas supply pipe 122c. The flow rate of the N$_2$ gas flowed into the inert gas supply pipe 122g is controlled by the MFC 124c. The flow-rate-controlled N$_2$ gas is joined with the TEMAZ gas to be supplied into the processing chamber 80 and exhausted from the exhaust pipe 90.

When the TEMAZ gas is flowed, the pressure inside the processing chamber 80 is set to a range of, for example, 50 to 400 Pa.

The supply flow rate of the TEMAZ gas controlled by the MFC 104c is set to a range of, for example, 0.1 to 0.5 g/min.

Time of exposure of the wafer 2 to the TEMAZ gas, i.e., a gas supply time (irradiation time) is set to a range of, for example, 30 to 240 seconds.

The temperature of the heater 72 is set such that the temperature of the wafer 2 (film forming processing temperature) is set to a range of, for example, 150 to 250° C.

By the supply of the TEMAZ gas, a third layer containing zirconium is formed on a base film of the surface of the wafer 2. That is, a zirconium layer (Zr layer) as a zirconium containing layer of less than 1 atomic layer to several atomic layers is formed on the wafer 2 (base film). The zirconium containing layer may be a chemical adsorption (surface adsorption) layer of TEMAZ. In addition, zirconium is an element that becomes solid by itself.

As well as continuous layer configured by zirconium, the zirconium layer may also include a discontinuous layer or a laminated layer thereof. In some cases, the continuous layer configured by zirconium is referred to as a "thin film".

In addition, the chemical adsorption layer of TEMAZ includes a discontinuous chemical adsorption layer, as well as a continuous chemical adsorption layer of TEMAZ molecule.

If the thickness of the zirconium containing layer formed on the wafer 2 exceeds several atomic layers, an oxidizing operation in step 124 does not influence the entire zirconium containing layer. In addition, the minimum value of the zirconium containing layer that can be formed on the wafer 2 is less than 1 atomic layer.

Therefore, it is preferable that the thickness of the zirconium containing layer is in a range from less than 1 atomic layer to several atomic layers.

By adjusting conditions such as the film forming processing temperature and the pressure inside the processing chamber 80, the state of the layer formed on the wafer 2 can be adjusted.

To be specific, if TEMAZ gas is in a self-decomposition condition, zirconium is deposited on the wafer 2 to form a zirconium layer. Meanwhile, if TEMAZ gas is not in the self-decomposition condition, TEMAZ is chemically adsorbed on the wafer 2 to form a chemical adsorption layer of TEMAZ gas.

In a case of forming the zirconium layer on the wafer 2, a film forming rate can be increased as compared to a case of forming a chemical adsorption layer of TEMAZ on the wafer 2.

In addition, in a case of forming the zirconium layer on the wafer 2, a denser layer can be formed as compared to a case of forming a chemical adsorption layer of TEMAZ on the wafer 2.
(Step 122)

In step 122, gas remaining within the processing chamber 80 is removed (sixth process).

After forming the zirconium containing layer, the valve 108c is opened and the valve 118c is opened, so that the supply of TEMAZ gas into the processing chamber is stopped and the TEMAZ gas is flowed into the bent line 110c.

At this time, the APC valve 94 of the exhaust pipe 90 remains opened and the inside of the processing chamber 80 is evacuated by the vacuum pump 96. Thus, unreacted TEMAZ gas remaining within the processing chamber 80 or TEMAZ gas after contribution to the formation of the zirconium containing layer is removed from the processing chamber 80. At this time, the valve 128c remains opened and the supply of $N_2$ gas into the processing chamber 80 is maintained.

This improves the effect that unreacted TEMAZ gas remaining within the processing chamber 80 or TEMAZ gas after contribution to the fog illation of the zirconium containing layer is removed from the processing chamber 80.
(Step 124)

In step 124, $O_3$ gas as an oxidizing gas is supplied into the processing chamber 80 (seventh process).

After removing a residual gas within the processing chamber 80, $O_2$ gas is flowed into the gas supply pipe 102d. The $O_2$ gas flowed into the gas supply pipe 102d is changed to $O_3$ gas by the ozonizer 132.

By opening the valve 134d and the valve 108d of the gas supply pipe 102d and closing the valve 118d of the bent line 110d, the flow rate of the $O_3$ gas generated in the ozonizer 132 is controlled by the MFC 106d. The flow-rate-controlled $O_3$ gas is supplied from the gas supply holes 130d to the inside of the processing chamber 80 and is exhausted from the exhaust pipe 90.

At this time, the valve 128d is opened so that $N_2$ gas is flowed into the inert gas supply pipe 122d. The flow rate of the $N_2$ gas flowed into the inert gas supply pipe 122d is controlled by the MFC 124d. The flow-rate-controlled $N_2$ gas is joined with the $O_3$ gas to be supplied into the processing chamber 80 and exhausted from the exhaust pipe 90.

When the $O_3$ gas is flowed, the pressure inside the processing chamber 80 is set to a range of, for example, 50 to 400 Pa.

The supply flow rate of the $O_3$ gas controlled by the MFC 104d is set to a range of, for example, 10 to 20 slm.

Time of exposure of the wafer 2 to the $O_3$ gas, i.e., a gas supply time (irradiation time) is set to a range of, for example, 60 to 300 seconds.

The temperature of the heater 72, like step 120, is set such that the temperature of the wafer 2 is set to a range of, for example, 150 to 250° C.

At this time, the gas supplied into the processing chamber 80 is $O_3$ gas, and the TEMAZ gas is not supplied into the processing chamber 80. Therefore, the $O_3$ does not make a vapor phase reaction and reacts with a part of the zirconium containing layer being a third layer formed on the wafer 2 in step 120.

Hence, the zirconium containing layer is oxidized to form a fourth layer containing zirconium and oxygen, i.e., a zirconium oxide layer ($ZrO_2$ layer).
(Step 126)

In step 126, gas remaining within the processing chamber 80 is removed (eighth process).

By closing the valve 108d of the gas supply pipe 102d and opening the valve 118d, the supply of $O_3$ into the processing chamber 80 is stopped, and $O_3$ gas is flowed into the bent line 110d.

At this time, the APC valve 94 of the exhaust pipe 90 remains opened and the inside of the processing chamber 80 is evacuated by the vacuum pump 96. Thus, unreacted $O_3$ gas remaining within the processing chamber 80 or $O_3$ gas after contribution to the oxidation is removed from the processing chamber 80. At this time, the valve 128d remains opened and the supply of $N_2$ gas into the processing chamber 80 is maintained.

$N_2$ gas acts as a purge gas, and gas remaining within the processing chamber 80 is removed from the processing chamber 80 (purge).

This improves the effect that unreacted $O_3$ gas remaining within the processing chamber 80 or $O_3$ gas after contribution to the oxidation is removed from the processing chamber 80.
(Step 128)

In step 128, steps 120 to 126 are set as 1 cycle, and it is determined whether the cycle is performed predetermined number of times. If the cycle is performed the predetermined number of times, the process proceeds to step 132 and, if not, the process proceeds to step 120.

As such, by performing the cycle of steps 120 to 126 at least one time, a zirconium oxide film containing zirconium and oxygen may be formed to a predetermined thickness.

It is preferable that the cycle of steps 110 to 116 is repeated for plural times.
(Unloading Process)
(Step 132)

If the insulating film forming process is completed, the pressure inside the processing chamber 80 in which the inside atmosphere is replaced with $N_2$ gas is returned to normal pressure (atmospheric pressure return).
(Step 134)

Thereafter, the seal cap 48 is moved downwardly by the elevator 44, so that the lower end part of the reaction tube 74 is opened and simultaneously the processed wafer 2 is unloaded from the lower end part of the reaction tube 74 to the exterior, with being held in the boat 38 (boat unload).
(Step 136)

Next, the processed wafer 2 is discharged from the boat 38 by the wafer transfer device 36a (wafer discharge).

In addition, although the film formation of the titanium nitride film and the film formation of the zirconium oxide film are performed using the film forming processing apparatus 10 of the same substrate processing apparatus system, the film formation of the laminated film may be performed using a separate titanium nitride film forming apparatus and a separate zirconium oxide film forming apparatus having a configuration equivalent to the film forming processing apparatus 10.

<Reforming Process>

Next, the reforming operation by the reforming processing apparatus 200 of the substrate processing apparatus system will be described.

Figure 8:
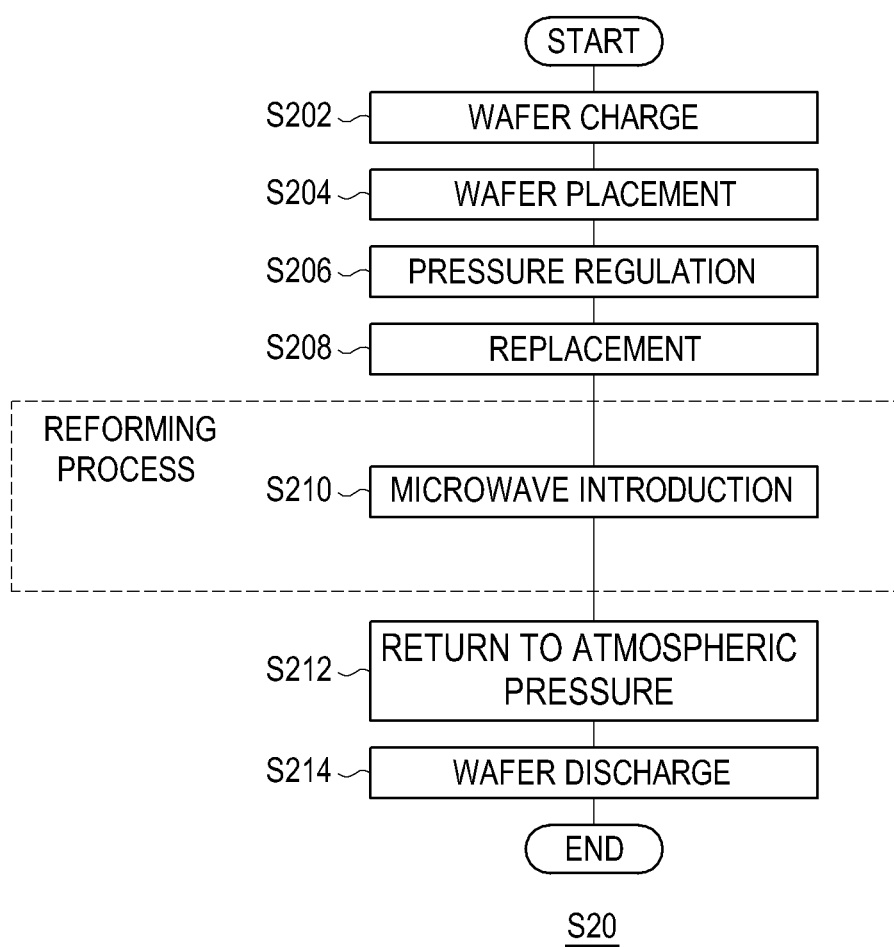
FIG. 8 is a flowchart of a reforming operation of the reforming processing apparatus according to the first embodiment of the present disclosure.

FIG. 8 is a flowchart of a reforming operation S20 by the reforming processing apparatus 200.
(Substrate Loading Process)
(Step 202)

In the substrate loading process of loading the wafer 2, where the zirconium oxide film is formed, into the processing chamber 210, the gate valve 272 is first opened to communicate the processing chamber 210 with the transfer chamber. Then, the wafer 2 being a processing target is loaded from the transfer chamber to the inside of the processing chamber 210 by the transfer robot (wafer charge).
(Step 204)

The wafer 2 loaded into the processing chamber 210 is placed on the upper end of the substrate support pin 213 by the transfer robot and is supported by the substrate support pin 213. Thereafter, if the transfer robot is returned from the inside of the processing chamber 210 to the inside of the transfer chamber, the gate valve 272 may be closed (wafer placement).
(Step 206)

The inside of the processing chamber 210 is evacuated by the vacuum pump (not shown) such that it is set to a desired pressure (vacuum degree). When the substrate is loaded, the ambient atmosphere outside the processing chamber comes in together. The inside of the processing chamber is sufficiently exhausted so that water or oxygen among the ambient atmosphere does not influence the process. At this time, the pressure inside the processing chamber 210 is measured by the pressure sensor (not shown), and the pressure regulating valve 263 is feedback controlled based on the measured pressure (pressure regulation).

(Step 208)

Then, the inside of the processing chamber 210 is replaced with nitrogen ($N_2$) atmosphere. Preferably, the inside of the processing chamber 210 is replaced with 100% $N_2$ gas. Gas (atmosphere) inside the processing chamber 210 is exhausted from the gas exhaust pipe 262 by the vacuum pump 264 and simultaneously $N_2$ gas is introduced from the gas supply pipe 252 to the inside of the processing chamber 210 (replacement). At this time, the pressure inside the processing chamber 210 is regulated to a predetermined value, e.g., atmospheric pressure, within a range of 200 Pa to 200,000 Pa.

(Reforming Process)
(Step 210)

Then, the microwave generated in the microwave generating unit 220 is introduced from the waveguide 222 to the inside of the processing chamber 210 and is irradiated on the surface side of the wafer 2. By the irradiation of the microwave, the zirconium oxide film on the surface of the wafer 2 is heated to 100 to 450° C., e.g., 400° C., and the zirconium oxide film is reformed, i.e., impurities such as C or H are released from the zirconium oxide film, and is densified so that it is reformed to a stable insulating thin film. In addition, the optimal heating temperature of the wafer 2 is different depending on the kind of film formed on the surface of the wafer 2. In addition, the optimal heating temperature is different depending on a base, an interconnection structure, and so on.

An insulator such as a high-k film including a zirconium oxide film has a different microwave absorption rate depending on a dielectric constant. As the dielectric constant is higher, it is easy to absorb the microwave. According to the research of the present inventors, it was known that if the wafer was processed by irradiating a high-power microwave thereon, an insulator film on the wafer was heated and reformed. In addition, it was known that the heating by the microwave was a dielectric heating depending on a dielectric constant ($\in$) and a dielectric tangent (tan $\delta$). Thus, if materials having different physical property values were simultaneously heated by the microwave, only a material easy to be heated, i.e., a material having a higher dielectric constant could be selectively heated to a higher temperature.

Annealing of the high-k film will be described. The high-k film has a higher dielectric constant ($\in$) than silicon that is a substrate material of the wafer. For example, while the relative dielectric constant ($\in_r$) of the silicon is 3.9, the relative dielectric constant ($\in_r$) of a HfO film being the high-k film is 25 and the relative dielectric constant ($\in_r$) of a ZrO film is 35. Therefore, if the microwave is irradiated on the wafer where the high-k film is formed, the high-k film is selectively heated to a higher temperature. In addition, it is apparent that the temperature difference between the silicon and the high-k film is alleviated by heat transfer.

According to the research of the present inventors, irradiation of the high-power microwave gives a greater film reforming effect. If the high-power microwave is irradiated, the temperature of the high-k film can be rapidly raised. However, if a microwave having a relatively lower power than the high-power microwave is irradiated for a long time, the temperature of the entire wafer is raised during the reforming process. This is because, if time passes by, the silicon itself is dielectric heated by the microwave, and the temperature of silicon is raised by heat transfer from the high-k film to the silicon. It is thought that the insulator can be heated to a high temperature by the dielectric heating until the temperature of the wafer is raised and reaches the upper limit temperature by irradiating the high-power microwave. For example, in the case of the HfO film, even though the temperature of the wafer is set to about 400° C. during the reforming, the temperature of the base is further raised. Thus, it is necessary to suppress the temperature rise by cooling.

Thus, in the current embodiment, the temperature rise of the wafer 2 is suppressed by supplying cooling water to the cooling passage 231 during the irradiation of the microwave. Preferably in some embodiments, by controlling the on-off valve 233 and the flow rate control device 234 such that the temperature of the wafer 2 is set to a predetermined temperature, the flow rate of the cooling water flowing through the coolant passage 231 is controlled. As such, by maintaining the processing temperature of the wafer 2 constantly, it is possible to improve reproducibility of the process result when a plurality of wafers are processed.

In addition, in the heating processing process, the control unit 300 opens the valve 253 to introduce $N_2$ gas from the gas supply pipe 252 to the inside of the processing chamber 210 and simultaneously exhausts $N_2$ gas inside the processing chamber 210 from the gas exhaust pipe 262 while regulating the pressure inside the processing chamber 210 to a predetermined value, such as atmospheric pressure in the current embodiment, using the pressure regulating valve 263. In this manner, in the reforming process, the inside of the processing chamber 210 is maintained at a predetermined pressure value. In this example, the heating processing was performed for five minutes with the microwave having a frequency of 0.5 to 300 GHz, preferably 1.0 to 50 GHz, more preferably 5.8 to 7.0 GHz, for example 5.8 GHz microwave, at power of 100 W to 2,000 W, for example, power of 1,600 W, and the temperature of the wafer 2 was set to 400° C. and the pressure inside the processing chamber 210 was set to atmospheric pressure. In addition, by controlling the flow rate of $N_2$ gas introduced into the processing chamber 210, the cooling of the wafer 2 may be performed.

In a case of actively using the cooling effect of $N_2$ gas, the gas supply pipe 252 is installed above the substrate support table and gas flows between the substrate and the substrate support table. In this manner, the cooling effect may be improved. By controlling the flow rate of this gas, the temperature control of the substrate may be performed.

In addition, although the $N_2$ gas is used in the current embodiment, if there is neither a process problem nor trouble in stability, it is possible to improve the cooling effect of the substrate by adding other gas having a high heat transfer rate, e.g., diluted He gas, or the like.

In this manner, with respect to the zirconium oxide film formed on the wafer 2, reformation such as crystal growth, restoration of oxygen defect, or removal of contained impurity (organic material or the like) is performed by exciting dipoles constituting the zirconium oxide film by vibration or rotation.

In addition, in the case of a high-k film such as a zirconium oxide film, a frequency band in which energy is efficiently absorbed to be used for heating exists in a microwave region. This is because of a peak dielectric dispersion caused by orientation polarization through a polarization phenomena, which occurs when an existing electric field is applied by the microwave and becomes the cause of a high dielectric constant, and a resonance type peak of ion polarization is shifted to a lower frequency band than a typical infrared region by crystallization. For the above-described reasons, the heating can be efficiently performed by appropriately selecting a frequency of a microwave for the high-k film.

For example, since the peak of the dielectric dispersion by the orientation polarization exhibits a relatively wide dispersion, the use of a several GHz microwave makes it possible to selectively and relatively easily heat a material such as a high-k film whose orientation polarization is easily attained. In addition, when a higher microwave region above a so-called millimeter wave is used, it can be expected to effectively use the heating effect by the ion polarization of the high-k film.

In addition, when it is intended to heat the high-k film more efficiently, it is effective to determine a suitable frequency band according to the following guideline. That is, a frequency characteristic of dielectric relaxation of the high-k film is previously measured. First, an imaginary number term of dielectric relaxation in an AC electric field and electromagnetic field of the high-k film is measured. In this manner, peak frequency unique to the target high-k film is obtained. The use of the microwave having a frequency equal to or more than $\frac{1}{2}$ of the peak frequency is effective in the present application.

For example, if Debye type relaxation having steep distribution is assumed, the absorption rate of the microwave is about half of the saturation value at the peak frequency and about quarter at $\frac{1}{2}$ of the peak frequency. Thus, for efficient heating, it is preferable in some embodiments to use a microwave having a frequency equal to or more than $\frac{1}{2}$ of the peak frequency. In addition, the peak of the relaxation of the high-k film tends to be shifted toward the high frequency side together with a temperature rise. Thus, if a high efficiency is desired after a temperature rise during the heating, it is effective to select a frequency higher than the peak frequency at room temperature, preferably, a frequency higher 10 times or more than the peak frequency at room temperature. On the contrary, if prevention of overheating at high temperature is desired, it is effective to lower the heating efficiency after the temperature rise by selecting a frequency lower than the peak frequency. In addition, although the above description has been given on the assumption of the Debye type relaxation, this guideline is not limited to the Debye type relaxation and it is apparent that it is also effective to other types of dielectric relaxation, or resonance type or oscillator type dispersion.

As mentioned above, after the reforming processing is performed by introducing the microwave for a predetermined time, the introduction of the microwave is stopped (microwave introduction).

In addition, in the current embodiment, the heating processing is performed without rotating the wafer 2 in a horizontal direction, but the heating processing may also be performed while rotating the wafer 2.

(Unloading Process)
(Step 212)

After the reforming processing is completed, the pressure inside the processing chamber 210 is returned to atmospheric pressure (atmospheric pressure return).

(Step 218)

By opening the gate valve 272, the processing chamber 210 and the transfer chamber communicate with each other. The processed wafer 2 is unloaded from the substrate support table 212 inside the processing chamber 210 to the transfer chamber 270 by the transfer robot (wafer discharge).

In addition, the pressure during the reforming processing is set to atmospheric pressure in the current embodiment but, if the reforming processing is performed under depressurization, the pressure inside the processing chamber 210 is returned to atmospheric pressure by introducing, for example, $N_2$ gas into the processing chamber 210, and then, the wafer 2 is unloaded. In addition, by installing a load lock chamber adjacent to the processing chamber, with a partition wall interposed therebetween, it is possible to exchange the wafer without returning to atmospheric pressure and continuously process the wafers. In addition, when the processing is not under depressurization, mixing-in of an atmospheric component or impurity from the exterior can be suppressed by installing a load lock chamber adjacent to the processing chamber, with a partition wall interposed therebetween. In that case, it is effective to set the pressure inside the processing chamber to be higher than that of the load lock chamber during the transferring.

In addition, in the current embodiment, if the processing environment is equal to or lower than 1 atmosphere, it is proposed that a vacuum pump is used to maintain the inside of the processing chamber 210 by depressurization. However, if the processing environment is higher than 1 atmosphere, a pump is unnecessary. In addition, in the exhaust step before the processing, various methods such as a purge using nitrogen gas is applicable, as well as compulsory exhaust using a pump.

In addition, although a single-wafer-type apparatus for processing one sheet of a substrate at a time has been described in the current embodiment, the present disclosure is not limited thereto. The present disclosure can also be applied to a batch-type apparatus for processing a plurality of substrates at a time, or a batch-type vertical apparatus for processing a plurality of stacked substrates at a time. The power of microwave supplied to the batch-type apparatus may be determined by the number of sheets of wafers multiplied by the amount of power supplied for one sheet of the substrate (i.e., as much as the number of sheets of wafers, as compared to the case of processing one sheet of the substrate).

In addition, although the example of cooling the wafer 2 during the reforming processing has been described in the current embodiment, the wafer 2 may be cooled after the reforming process. The cooling is performed so as to control the crystalline property of the film. Since the crystal growth is also in progress while the wafer temperature is falling, a desired crystal structure can be obtained by suppressing the crystal growth and quenching the crystal growth by cooling as rapidly as possible. Therefore, for example, the wafer 2 is cooled to a predetermined temperature.

The wafer 2 may be cooled by inert gas after unloading (including a boat down in case of a vertical apparatus) of the wafer 2 from the processing chamber 210. In addition, the wafer 2 may be cooled by stopping the microwave and supplying the inert gas to the inside of the processing chamber 210, preferably to the rear surface of the wafer, for a predetermined time, while the wafer 2 is accommodated in the processing chamber 210, and then, the wafer 2 may be unloaded when it becomes a predetermined temperature.

(Second Embodiment)

Figure 9:
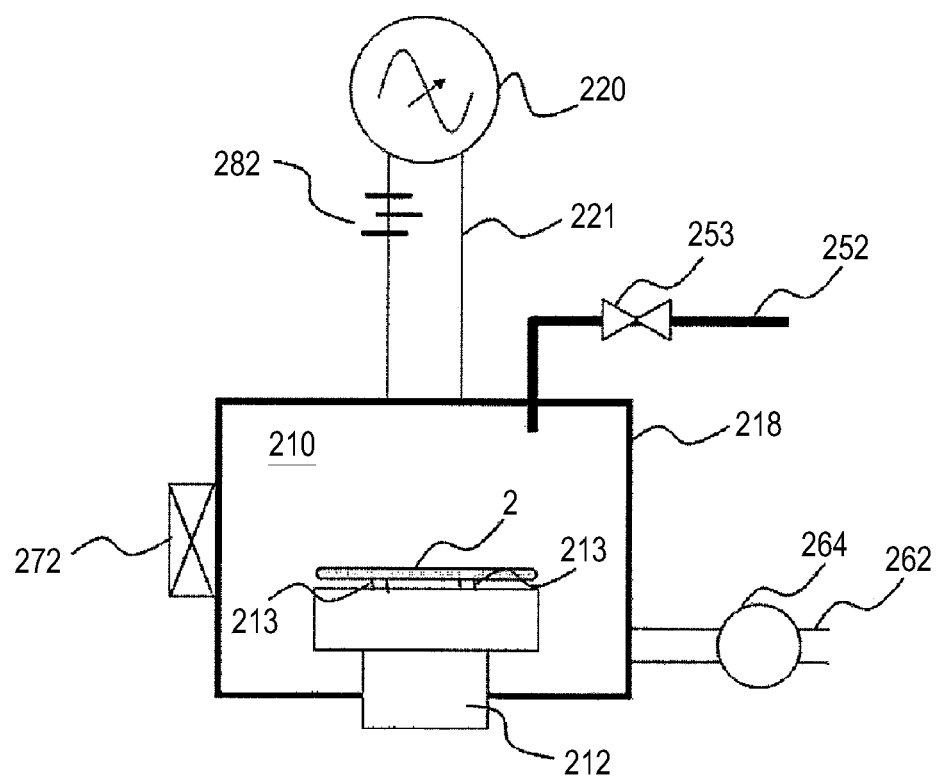
FIG. 9 is a vertical sectional view of a reforming processing apparatus according to a second embodiment of the present disclosure.

A substrate processing apparatus system according to a second embodiment of the present disclosure will be described with reference to FIG. 9. FIG. 9 is a vertical sectional view of a reforming processing apparatus included in the substrate processing apparatus system according to the second embodiment of the present disclosure.

In the second embodiment, the reforming process is performed by varying (changing with time) a frequency of a microwave generated in a microwave generating unit 220 in the reforming processing apparatus. Since the other aspects are the same as the first embodiment, their description will be omitted.

When a frequency suitable for excitation of a thin film is selected, if the frequency is determined uniquely, a standing wave is generated through interference with a wall surface, and a difference in a local effective power occurs depending on a location. When the frequency has a plurality of discrete values such as 2-cycle or 3-cycle, the deviation of effective power by the standing wave is somewhat alleviated. However, in essentials, similar problems occur. Meanwhile, when a frequency is varied within a certain bandwidth and a varied frequency band is set to a frequency band to which a dipole of a target polarization film responds, if the resonant frequency of the polarization film has a gentle distribution in a relatively wide band, the energy of the microwave is absorbed in the target polarization film in a wide frequency band at which the position of the standing wave is different. Therefore, position dependency of the effective power and the deviation of the reforming effect due to the position dependency are great alleviated.

In addition, when the frequency of the microwave is varied, the height from the substrate support table 212 to the wafer 2 is preferably obtained in some embodiments by the wavelength of a representative frequency of the varying frequency band. For example, when the frequency of the microwave is changed to 5.8-7.0 GHz, the representative frequency is set as the center frequency of the varying frequency band and the height from the substrate support table 212 to the wafer 2 is set to 115 mm, based on the 46 mm wavelength of the 6.4 GHz representative frequency.

(Third Embodiment)

Figure 10:
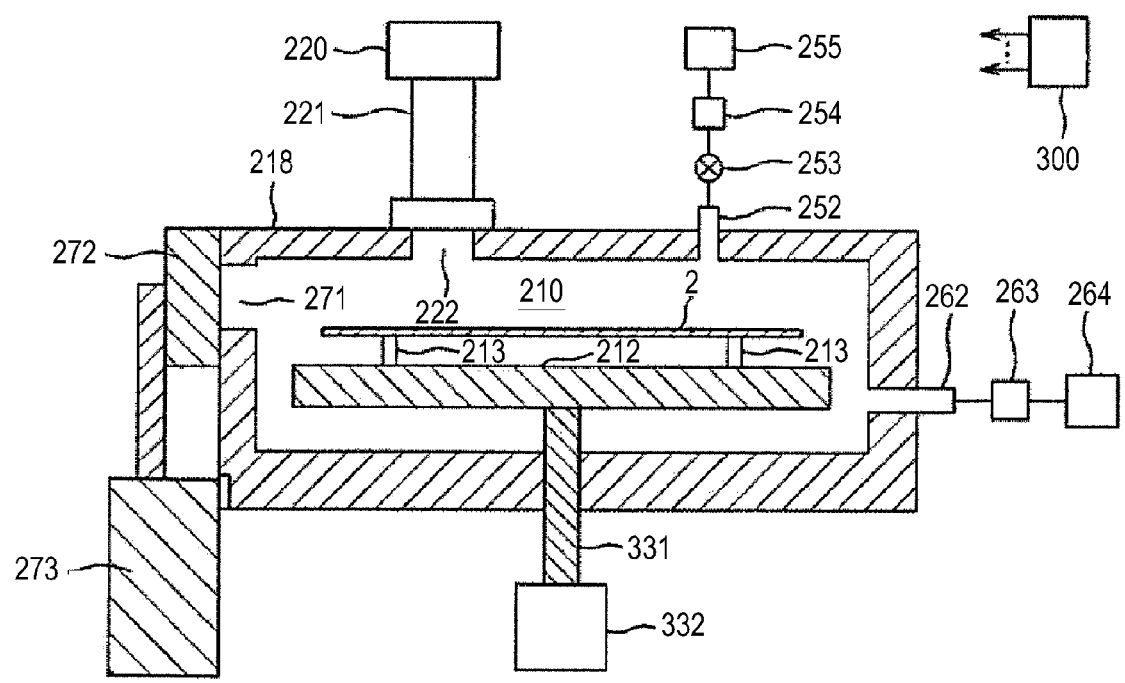
FIG. 10 is a vertical sectional view of a reforming processing apparatus according to a third embodiment of the present disclosure.

A substrate processing apparatus system according to a third embodiment of the present disclosure will be described with reference to FIG. 10. FIG. 10 is a vertical sectional view of a reforming processing apparatus included in the substrate processing apparatus system according to the third embodiment of the present disclosure.

In the third embodiment, a mechanism that can modify a relative position relation between a substrate and an inner wall of a processing chamber is provided in the reforming processing apparatus. Since the other aspects are the same as the first embodiment or the second embodiment, their description will be omitted.

When a frequency suitable for excitation of a thin film is selected, if the frequency is determined uniquely, a standing wave is generated by interference effect with a wall surface, and a difference in a local effective power occurs depending on location. This effect is remarkable when a resonant frequency to which a target polarization film responds has a steep distribution, and there are cases in which sufficient effects cannot be obtained even though the frequency of the microwave is varied. To solve this problem, in the current embodiment, a mechanism that can modify a relative position relation between a wafer and a wall is provided.

In addition, energy is attenuated whenever the microwave emitted from the waveguide opening 222 is reflected on the wall surface of the processing chamber 210. In the case of processing the substrate, the substrate can be rapidly heated by irradiating a high-energy microwave on the substrate. In the research of the present inventors, the case of directly irradiating the microwave on the wafer showed a higher substrate reforming effect than when processing the wafer in a state that a reflected wave is dominant.

However, in the case of directly irradiating the microwave on the wafer, the size of the waveguide opening is small compared to the area of the wafer. In addition, the microwave is not spread after the microwave is emitted from the waveguide opening. Thus, it is not easy to make the energy of the microwave irradiated on the surface of the wafer uniform. In addition, even though the microwave is directly irradiated on the wafer, all energy is not absorbed into the wafer, and a part of the energy is reflected from the wafer surface or a part of the energy passes through the wafer. This reflected microwave generates a standing wave within the processing chamber. If the standing wave is generated within the processing chamber, a part of the wafer surface is well heated, and a part of the wafer is not well heated. This leads to a non-uniform heating of the wafer and deteriorates a wafer in-plane uniformity of the film quality.

Therefore, in the current embodiment, the waveguide opening 222 is provided in the top wall of the processing chamber 210, and the distance between the waveguide opening 222 and the surface of the wafer 2 supported by the substrate support pin 213 is set to be shorter than 1 wavelength of the supplied microwave. In the current embodiment, the frequency of the microwave used is set to 5.8 GHz, and the wavelength of the microwave is set to be shorter than 51.7 mm. It is thought that within a range of 1 wavelength distance from the waveguide opening, the direct microwave emitted from the waveguide opening is dominant. In the above case, since the direct microwave emitted from the waveguide opening 222 is dominant, the influence of the standing wave within the processing chamber can be reduced. Therefore, the wafer near the waveguide opening 222 can be rapidly heated.

However, this method alone deteriorates the wafer in-plane uniformity because only a part of the wafer 2 neighboring the waveguide opening 222 is heated.

Therefore, in the current embodiment, the waveguide opening 222 faces the surface of the wafer 2 supported by the substrate support pin 213 but the center position of the waveguide 222 is eccentric from the center position of the wafer 2 supported by the substrate support pin 213. In this example, the diameter of the wafer 2 is 300 mm, and the distance from the center position of the waveguide opening 222 to the center position of the wafer 2 is 90 mm. In addition, the wafer 3 is rotated by a rotation driving unit 332 to be described later and the wafer surface is scanned by the microwave irradiated from waveguide opening 222. Thus, the wafer 2 can be heated more uniformly.

The substrate support table 212 is supported by a rotating shaft 331 made of a metal such as stainless steel (SUS), and the rotating shaft 331 is rotated in a horizontal direction by the rotation driving unit 332. Therefore, the rotating shaft 331, the substrate support table 212, and the wafer 2 can be rotated in a horizontal direction by the rotation driving unit 332. The rotation driving unit 332 is electrically connected to the control unit 300 and is controlled by the control unit 300.

The wafer surface is rapidly heated by the microwave when the wafer stays near the waveguide opening 222, but, when it is far away from the waveguide opening 222, it is difficult to heat the wafer surface, so the wafer temperature decreases. As such, rotating the wafer 2 can suppress the temperature rise in the entire wafer. More preferably in some embodiments, by cooling the wafer 2 during the irradiation of the microwave, the temperature rise of the wafer 2 is suppressed. To cool the wafer 2, for example, an amount of $N_2$ gas passing through the inside of the processing chamber 210 is increased, or a cooling passage for circulating a coolant is installed in the substrate support table 212.

In FIG. 10, the waveguide opening 222 is eccentric from the center position of the wafer 2. However, like in FIG. 11A, the waveguide opening 222 may be installed at a position facing the center position of the wafer 2, and the rotating shaft 331 may be installed at a position spaced apart from the center position of the substrate support table 212.

Figure 11A:
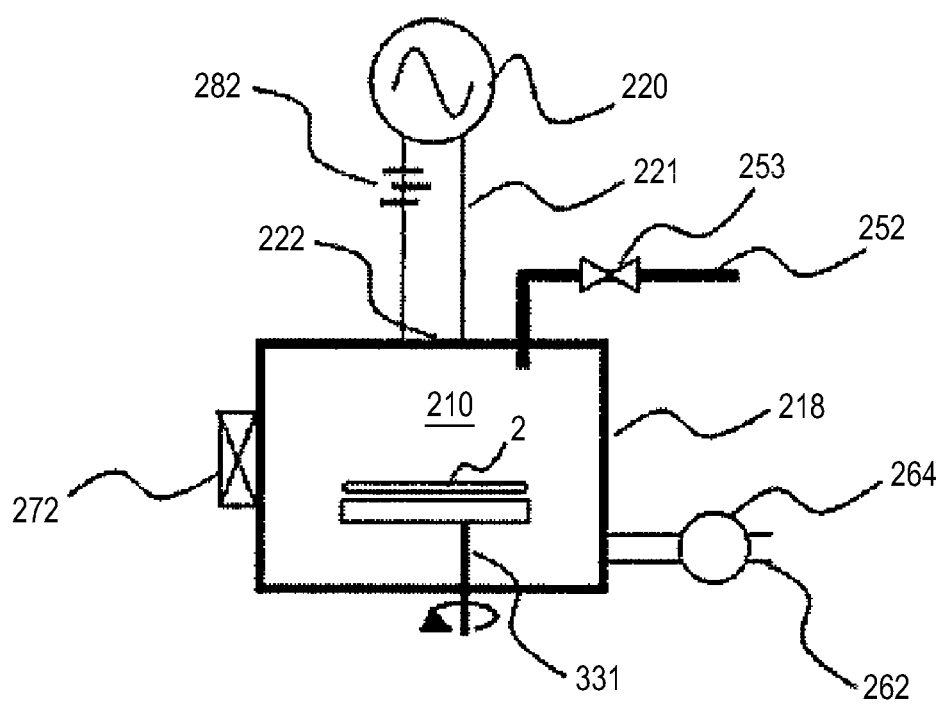
FIG. 11A, FIG. 11B and FIG. 11C are schematic views explaining another example of the reforming processing apparatus according to the third embodiment of the present disclosure.
Figure 11B:
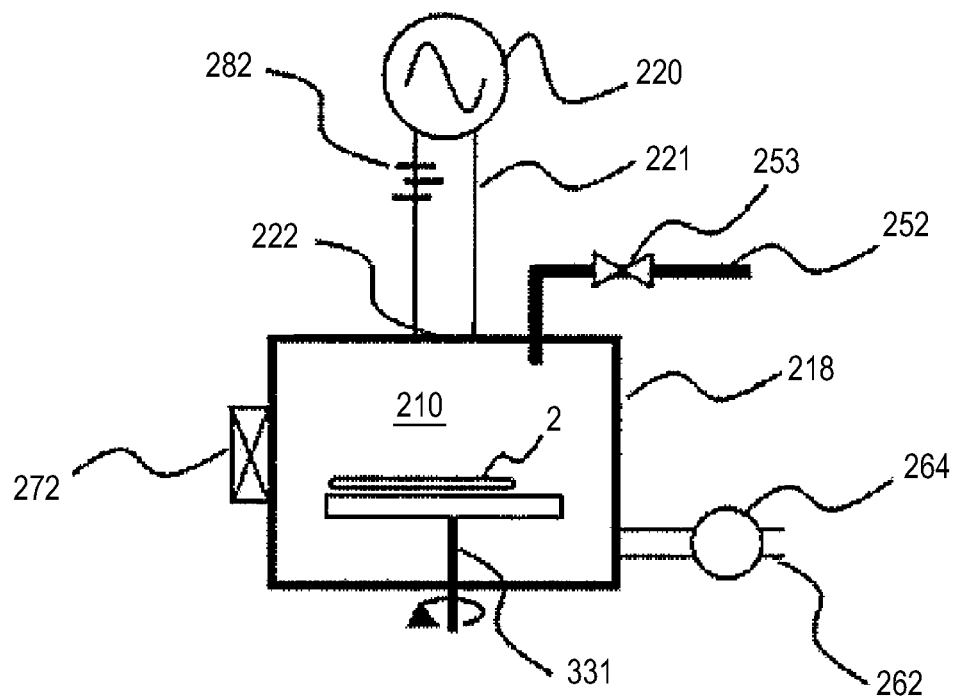

Alternatively, like in FIG. 11B, the waveguide opening 222 may be provided at a position facing the center position of the substrate support table 212 and the wafer 2 may be placed at an end position of the substrate support table such that the center position of the wafer 2 and the center position of the substrate support table 212 are not aligned with each other.

Figure 11C:
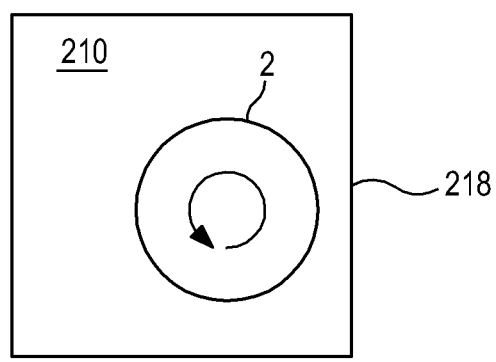

In the configurations of FIGS. 11A and 11B, by rotating the wafer 2, the waveguide opening 222 may become eccentric from the rotation center of the wafer 2, as shown in FIG. 11C.

(Fourth Embodiment)

Figure 12A:
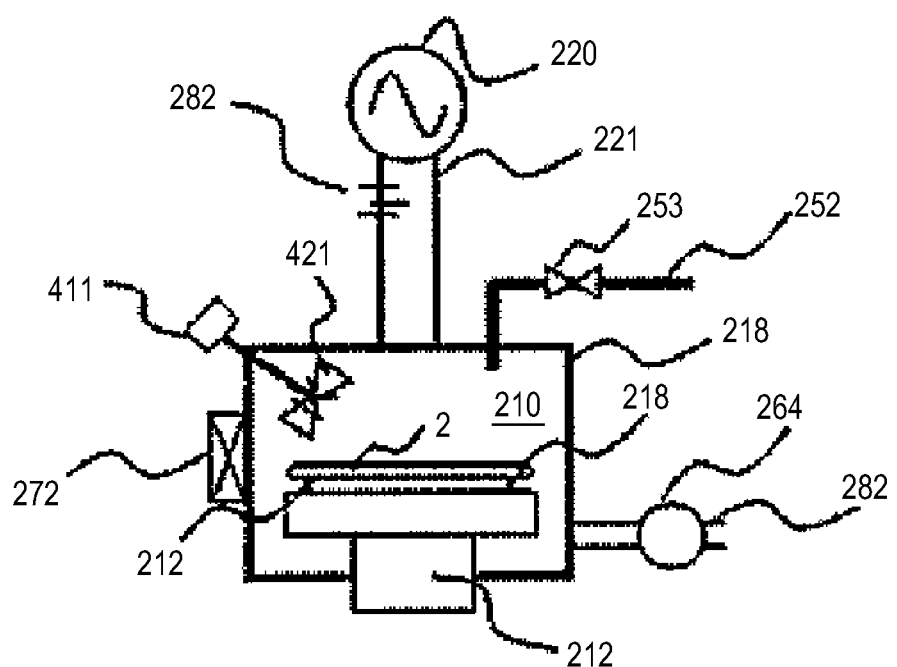
FIG. 12A, FIG. 12B and FIG. 12C are schematic views explaining an example of a reforming processing apparatus according to a fourth embodiment of the present disclosure.
Figure 12B:
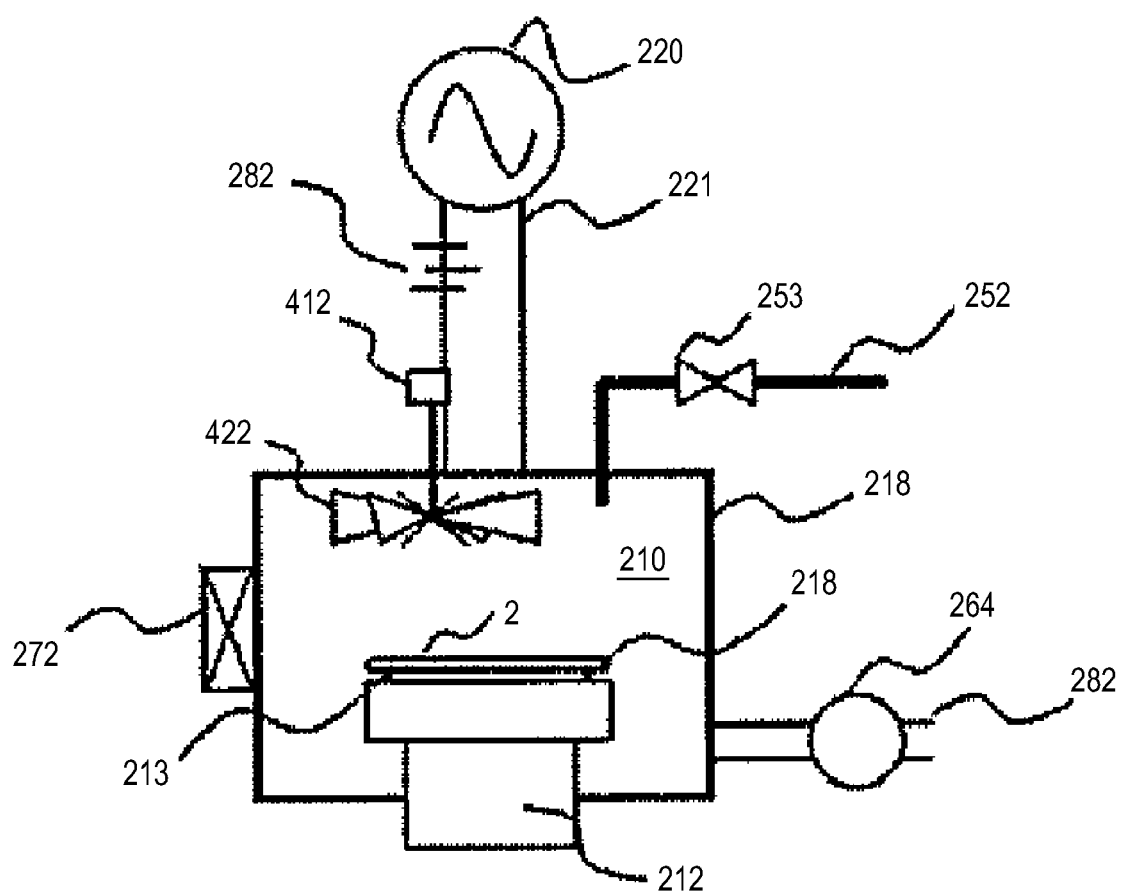
Figure 12C:
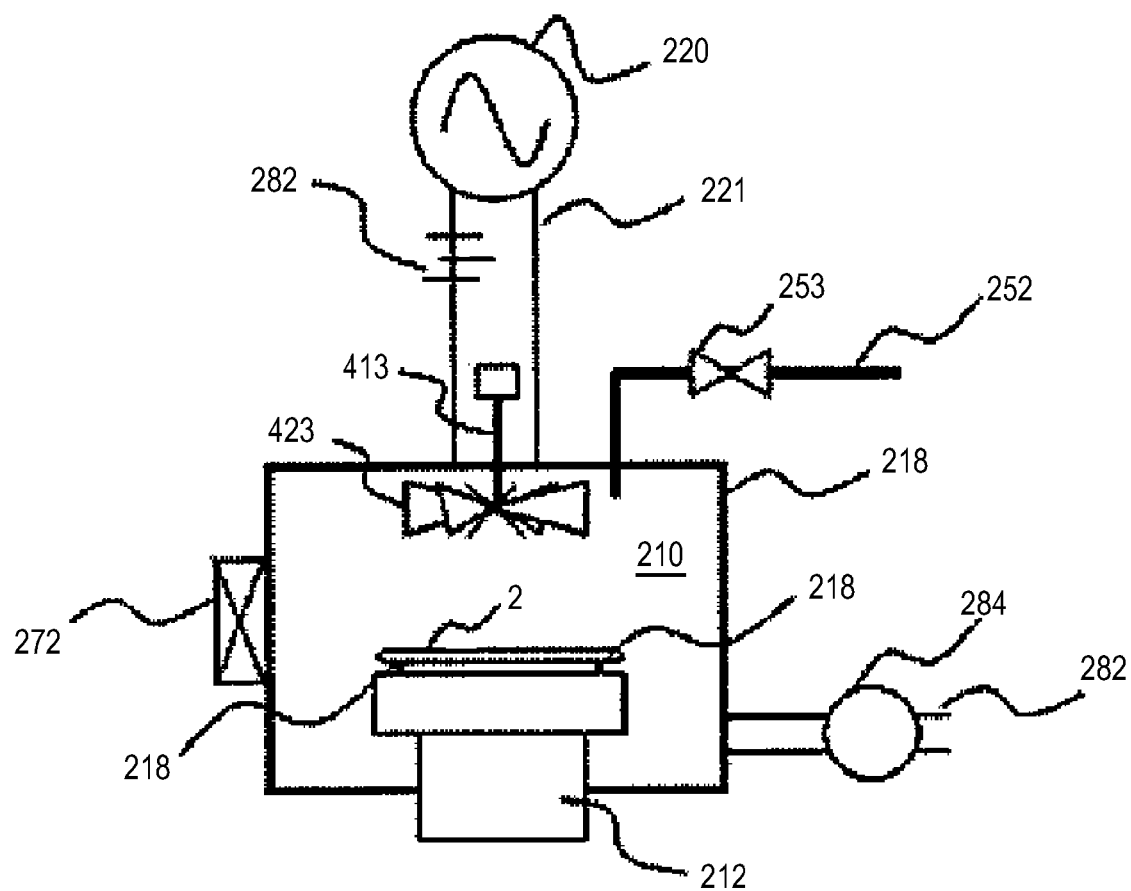

A substrate processing apparatus system according to a fourth embodiment of the present disclosure will be described with reference to FIG. 12A, FIG. 12B and FIG. 12C. FIG. 12A, FIG. 12B and FIG. 12C are vertical sectional views of a reforming processing apparatus included in the substrate processing apparatus system according to the fourth embodiment of the present disclosure.

The third embodiment discloses the invention that reduces the excitation position dependency of the microwave on the substrate surface due to the generation of the standing wave inside the processing chamber, by providing the mechanism that can modify the relative position relation between the substrate and the inner wall of the processing chamber. Meanwhile, the fourth embodiment reduces the excitation position dependency of the microwave on the substrate surface by installing a reflecting mechanism (diffusing mechanism) within the processing chamber of the reforming processing apparatus to reflect and diffuse the microwave in the processing chamber. Since the other aspects are the same as the third embodiment, their detailed description will be omitted.

In FIG. 12A, the reflecting mechanism includes a rotating mechanism 411 and a movable reflective plate (movable diffusion plate) 421. For example, a movable reflective plate 421 having the rotating mechanism 411 is installed at the upper wall of the processing vessel 218 adjacent to the sidewall in the upper part of the processing chamber 210, or at an interface between the upper wall and the sidewall of the processing vessel 218. If a standing wave is generated within the processing chamber 210, a hot spot having the maximum amplitude and a cold spot having zero amplitude exist, so uniform excitation on the surface of the wafer 2 is difficult. However, by installing the rotating mechanism, the microwave is reflected and diffused in the processing chamber 210, so the position dependency can be reduced. In addition, the diffusion effect of the microwave can be further improved by rotating the reflecting mechanism by the rotating mechanism 411.

In addition, like in FIG. 12B, the reflecting mechanism having a rotating mechanism 412 and a movable reflective plate (movable diffusion plate) 422 may be installed on the upper wall of the processing vessel 218 at a position that deviates from the center position of the wafer 2, in the upper part of the processing chamber 210. When the movable reflective plate 422 is installed between the waveguide 221 and the wafer 2 in this way, the position dependency can be reduced by reflecting and diffusing the microwave in the processing chamber 210. In addition, the diffusion effect of the microwave can be further improved by rotating the reflecting mechanism by the rotating mechanism 411.

In addition, as shown in FIG. 12C, the reflecting mechanism having a rotating mechanism 413 and a movable reflective plate (movable diffusion plate) 423 may be installed on the upper wall of the processing vessel 218 at a position corresponding the center position of the wafer 2, in the upper part of the processing chamber 210. When the movable reflective plate 422 is installed between the waveguide 221 and the wafer 2 in this way, the position dependency can be reduced by reflecting and diffusing the microwave in the processing chamber 210. In addition, the diffusion effect of the microwave can be further improved by rotating the reflecting mechanism by the rotating mechanism 413.

In addition, configurations other than FIGS. 12A, 12B and 12C can also be applied as long as the excitation position dependency of the microwave is reduced by reflecting and diffusing the microwave in the processing chamber 210.

As the material of the movable reflective plates 421, 422 and 423, a metal having a low resistance is suitable, for example, copper, SUS, and aluminum may be used.

(Fifth Embodiment)

A substrate processing apparatus system according to a fifth embodiment of the present disclosure will be described with reference to FIG. 13. The configuration of the fifth embodiment can be applied to both the first and second embodiments. In the current embodiment, the substrate processing apparatus system has a batch type vertical apparatus as a reforming processing apparatus. A film forming processing apparatus is similar to those of the first and second embodiments. In addition, the reforming processing process is similar to those of the first to fifth embodiments. In the reforming processing apparatus of the present disclosure, the structure of the processing furnace is different from that of the film forming processing apparatus, but the other aspects are similar. Thus, their description will be omitted.

The structure of the processing furnace 635 of the current embodiment will be described with reference to FIG. 13. The processing furnace 635 is provided with a shield 636. The shield 636 is made of a conductive material that can effectively prevent leakage of an electromagnetic wave to the exterior. For example, such a conductive material may be copper, aluminum, stainless steel, platinum, silver, and the like. However, the material used for forming the shield 636 is not limited to the conductive material. The shield 636 may be made of a multilayer shield material. For example, the multilayer shield material may be constructed by forming a reflection surface, which reflects the electromagnetic wave, and an absorption layer, which absorbs the electromagnetic wave, on the inner surface of the substrate made of a conductive material.

The shield 636 is formed in a cylindrical shape with one end opened and the other end closed. The shield 636 is disposed vertically such that the center line is perpendicular, and thus is fixedly supported. The cylindrical hollow part of the shield 636 forms a processing chamber 637 in which a plurality of wafers 2 are accommodated, and the inner diameter of the shield 636 is set to be larger than the maximum outer diameter of the wafer 2 to be treated.

At the lower end part of the shield 636, a furnace throat flange 638 is installed. The furnace throat flange 638 forms a furnace throat 639 of the processing furnace 635. In a state that the furnace throat flange 638 is supported by a sub housing 624, the shield 636 is vertically installed.

Figure 13:
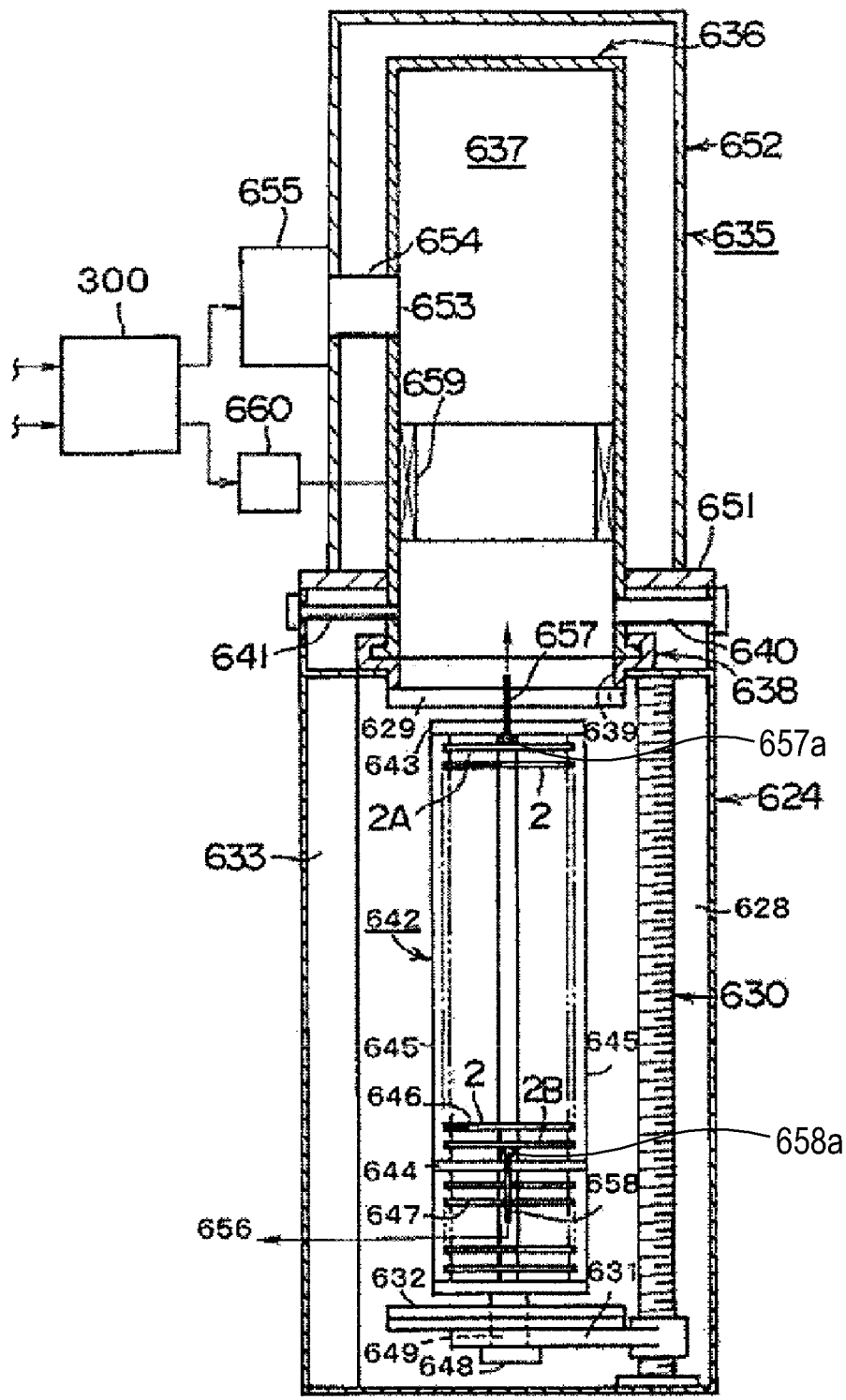
FIG. 13 is a schematic view explaining an example of a reforming processing apparatus according to a fifth embodiment of the present disclosure.

As illustrated in FIG. 13, a boat elevator 630 is installed below the processing furnace 635. A seal cap 632 supported on an arm 631 of the boat elevator 630 closes the furnace throat 639. That is, the seal cap 632 is formed in a disk shape that has a diameter almost equal to the outer diameter of the furnace throat flange 638, and is moved upwardly by the elevator 630 to air-tightly seal the furnace throat 639. One end of an exhaust pipe 640 is connected to the lower end sidewall of the shield 636, and the other end of the exhaust pipe 640 is connected to an exhaust device (not shown). The exhaust device exhausts the processing chamber 637 via the exhaust pipe 640.

One end of a gas supply pipe 641 for supplying gas to the processing chamber 637 is connected to a different position from the exhaust pipe 640 of the shield 636.

On the seal cap 632, a boat (substrate support unit, substrate support member) 642 supporting the wafers 2 is erected and supported. The boat 642 holds a plurality of wafers 2 and is loaded into the processing chamber 637 (boat loading) or is unloaded from the processing chamber 637 (boat unloading). The boat 642 is made using an insulator such as quartz. The boat 642 is provided with a pair of end plates 643 and 644, and three holding posts 645. The three holding posts 645 crosslink the two end plates 643 and 644 in a vertical direction. At the three holding posts 645, a plurality of holding grooves 646 are vertically arranged at equal intervals, and the holding grooves 646 of the same stage constructs the same plane. That is, the boat 642 holds the outer circumference of the wafer 2 using the holding grooves 646 of the same stage, so that the plurality of wafers 2 are retained, with their center aligned. At the lower part of the boat 642, a plurality of heat insulation plates 647 are disposed. The heat insulation plates 647 suppress the radiation of heat from the processing chamber 637.

At the bottom center of the seal cap 632, a rotary actuator 648 is installed. A rotating shaft 649 of the rotary actuator 648 supports the boat 642. That is, the rotary actuator 648 rotates the boat 642 by the rotating shaft 649. At the outside of the shield 636, a base 651 is horizontally disposed, and a case 652 is installed on the base 651 in a concentric configuration with the shield 636. The case 652 is formed in a cylindrical shape or polygonal cylindrical shape with an upper end closed and is larger than the shield 636. The case 652 encloses the outside of the shield 636 to prevent leakage of an electromagnetic wave, whereby the shield 636 is protected and simultaneously the surrounding environment is protected. In addition, the case 652 may be omitted.

An electromagnetic wave introduction port 653 is drilled at the sidewall of the shield 636. One end of a waveguide 654 for supplying an electromagnetic wave into the processing chamber 637 is connected to the electromagnetic introduction port 653. The other end of the waveguide 654 is connected to a microwave generating unit (electromagnetic wave source) 655 as a heating source that supplies the electromagnetic wave into the processing chamber 637 and heats it. The microwave generating unit 655 supplies a microwave (including a millimeter wave) being an electromagnetic wave. The microwave generating unit 655 supplies an electromagnetic wave of 0.5 to 300 GHz to the waveguide 654.

A controller 300 is connected to the microwave generating unit 655. An upper thermocouple 657 being an upper thermometer that measures temperature of an upper part inside the processing chamber 637, and a lower thermocouple 658 being a lower thermometer that measures temperature of a lower part inside the processing chamber 637, are connected to the controller 300. A thermal contact point 657a as a detecting element of the upper thermocouple 657 is disposed on a wafer 2A set in the uppermost stage of the boat 642 (referred to as an upper monitor wafer) for monitoring an upper temperature, and a thermal contact point 658a as a detecting element of the lower thermocouple 658 is disposed on a wafer 2B set in the lowermost stage of the boat 642 (referred to as a lower monitor wafer) for monitoring a lower temperature. Therefore, the upper thermocouple 657 measures the temperature of the upper monitor wafer 2A and transmits it to the controller 300, and the lower thermocouple 658 measures the temperature of the lower monitor wafer 2B and transmits it to the controller 300.

The upper monitor wafer 2A and the lower monitor wafer 2B are manufactured such that thermal characteristic, in particular, temperature characteristic, becomes equal to the wafer to be thermally treated (hereinafter, in some cases, referred to as a product wafer). The upper monitor wafer 2A and the lower monitor wafer 2B may use the product wafer 2 that becomes a disused article.

A plurality of product wafers 2 are disposed between the upper monitor wafer 2A and the lower monitor wafer 2B of the boat 642.

It is preferable in some embodiments that the number of product wafers 2 disposed is 20 to 30. This is because it corresponds to diffusion of beam when the microwave is introduced from a single electromagnetic introduction port 653, and a distance between the microwave and an edge of the product wafer 2 is about 150 cm. Preferably in some embodiments, the number of the product wafers 2 is 25. This is because it corresponds to the reception number of the boat 642 and matches the wafer transfer mechanism.

At the lower part of the inner circumference of the shield 636, an auxiliary heater 659 for heating the lower part is installed concentrically, and the auxiliary heater 659 is installed in the vicinity of the lower monitor wafer 2B. The auxiliary heater 659 is made of a resistance heating element or the like and is connected to a power source 660 controlled by the controller 300. The controller 300 controls the microwave generating unit 655 and the power source 660, such that the temperature of the upper thermocouple 657 and the temperature of the lower thermocouple 658 become equal to each other, by feedback controlling the microwave generating unit 655 based on the measured temperature of the upper thermocouple 657 and feedback controlling the auxiliary heater 659 based on the measured temperature of the lower thermocouple 658.

Figure 14:
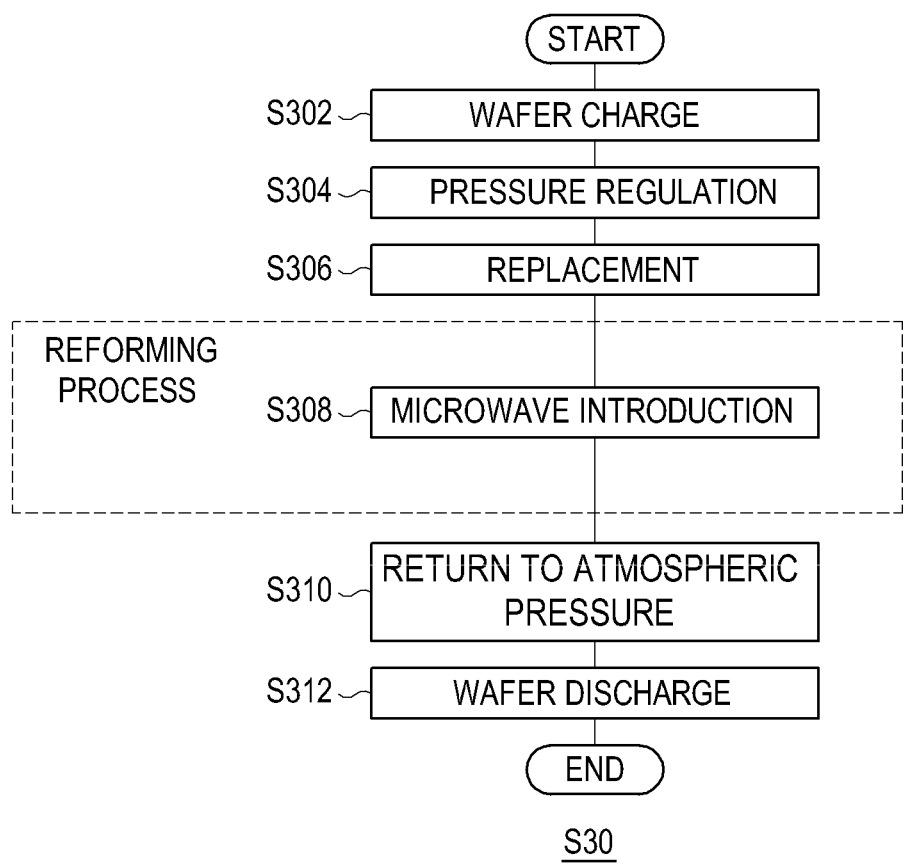
FIG. 14 is a flowchart of a reforming operation of the reforming processing apparatus according to the fifth embodiment of the present disclosure.

Next, a reforming operation using a batch type reforming processing apparatus relevant to the present configuration will be described. FIG. 14 is a flowchart of a reforming operation (S30) by the batch type reforming processing apparatus.

(Substrate Loading Process)
(Step 302)

Figure 15:
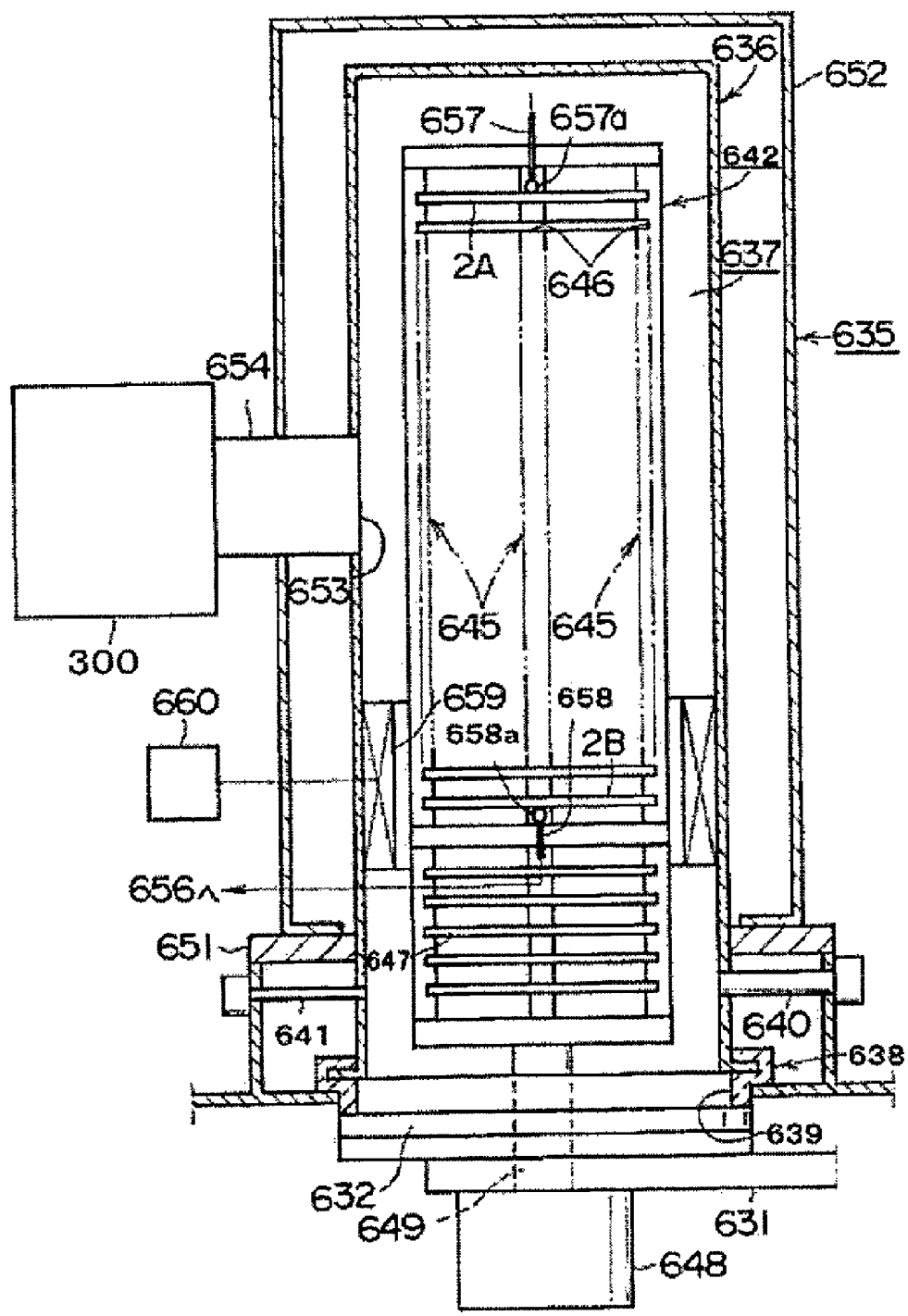
FIG. 15 is a schematic view explaining another example of the reforming processing apparatus according to the fifth embodiment of the present disclosure.

As illustrated in FIGS. 13 and 15, the upper monitor wafer 2A and the lower monitor wafer 2B having the same thermal characteristic as the product wafer 2 to be thermally treated are disposed at the uppermost stage and the lowermost stage of the boat 642, respectively. If a predetermined number of wafers 2 are transferred to the boat 642, the boat elevator 630 moves the boat 642 upward and loads it into the processing chamber 637 of the processing furnace 635 (boat loading), as illustrated in FIG. 14 (wafer charge). In addition, the interval between the product wafers 2 is equal to or more than half the wavelength of the irradiated electromagnetic wave (microwave or millimeter wave). That is, if the frequency of the electromagnetic wave is 10 GHz, the interval between the product wafers 2 is 15 cm or more; if 6 GHz, 2.5 cm or more; and if 3 GHz, 5 cm or more.

(Step 304)

If the boat 642 reaches the upper limit, the seal cap 632 closes the furnace throat 639 and thus the processing chamber 637 is air-tightly closed. If air-tightly closed, the exhaust pipe 640 exhausts the processing chamber 637 (pressure regulation).

(Step 306)

The rotary actuator 648 rotates the boat 642. At this time, inert gas such as nitrogen gas is supplied from the gas supply pipe 641 (replacement). The pressure inside the processing chamber 637 is regulated to a predetermined value within the range of 200 Pa to 200,000 Pa, for example, atmospheric pressure.

(Reforming Process)
(Step 308)

The microwave generating unit 655 raises the temperature of the wafer 2 to 100 to 450° C., for example, 400° C. That is, the microwave generating unit 655 supplies the microwave or millimeter wave to the inside of the processing chamber 637 through the waveguide 654. Since the microwave supplied into the processing chamber 637 is incident on the wafer 2 and is efficiently absorbed, the temperature of the wafer 2 is raised very effectively. In addition, the power of the microwave supplied into the processing chamber 637 corresponds to the power supplied for a single wafer, multiplied by the number of sheets of wafers.

At this time, the upper thermocouple 657 and the lower thermocouple 658 measure the temperature of the upper monitor wafer 2A and the temperature of the lower monitor wafer 2B, respectively, and transmit the measured temperatures to the controller 300. The controller 300 controls the microwave generating unit 655 and the power source 660, such that the temperature of the upper thermocouple 657 and the temperature of the lower thermocouple 658 become equal to each other, by feedback controlling the microwave generating unit 655 based on the measured temperature of the upper thermocouple 657 and feedback controlling the auxiliary heater 659 based on the measured temperature of the lower thermocouple 658. If a preset processing time passes by, the rotation of the boat 642, the supply of the gas, the supply of the microwave, and the exhaust of the exhaust pipe 640 are stopped (microwave introduction).

(Unloading Process)
(Step 310)

After the reforming process is completed, the pressure inside the processing chamber 210 is returned to atmospheric pressure (atmospheric pressure return).

(Step 312)

Thereafter, the boat elevator 630 moves the seal cap 632 downward to open the furnace throat 639 and simultaneously unload the boat 642 from the furnace throat 639 to the outside of the processing chamber (boat unloading) (wafer discharge).

By repeating the above-described operations, the plurality of wafers 2 are processed in a batch.

Figure 16:
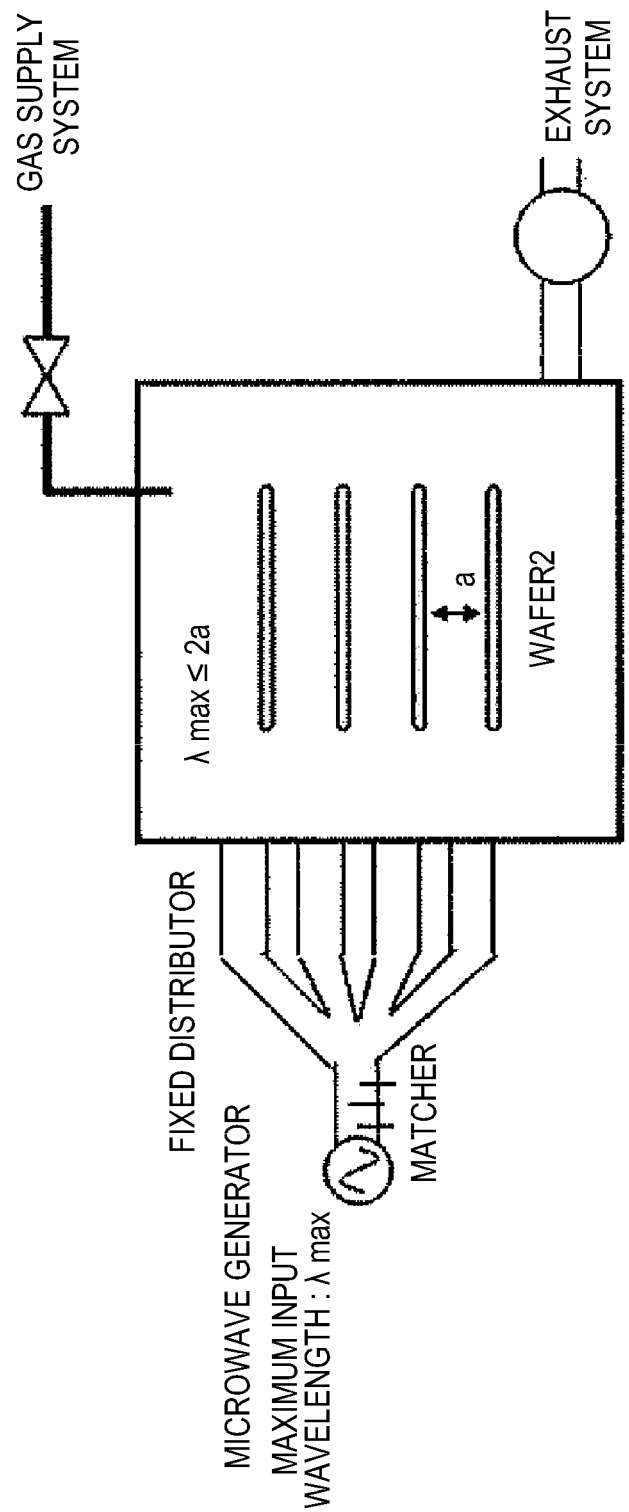
FIG. 16 is a schematic view explaining another example of the reforming processing apparatus according to the fifth embodiment of the present disclosure.

Although it has been described above that the single power source is provided and no distributor is installed, a fixed distributor may be installed to distribute the microwave for each wafer 2, as illustrated in FIG. 16.

Figure 17:
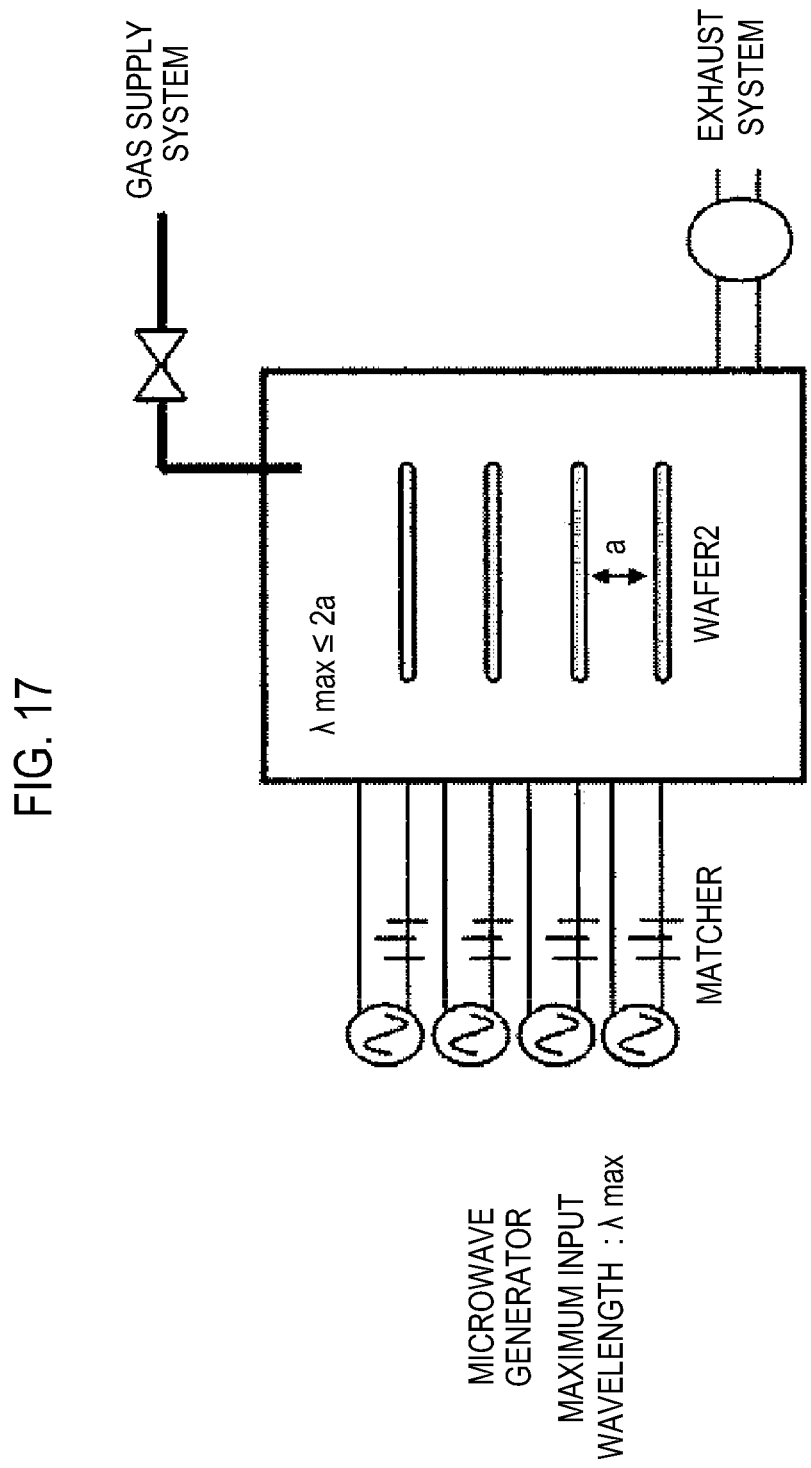
FIG. 17 is a schematic view explaining another example of the reforming processing apparatus according to the fifth embodiment of the present disclosure.

In addition, a plurality of power sources may be installed. For example, as illustrated in FIG. 17, a plurality of power sources may be installed for each wafer. In this case, waveguides are installed between the respective wafers.

Like the current embodiment, by processing a plurality of wafers in a batch, the throughput can be remarkably improved as compared to the case of processing the wafers one by one.

In addition, in the single-wafer-type apparatus, when a microwave is irradiated vertically with respect to the wafer surface, components reflected from the wafer exist. Meanwhile, by irradiating the microwave horizontally like the vertical type apparatus, it is possible to suppress the reflection from the uppermost wafer adjacent to the waveguide when the microwave is irradiated vertically.

(Sixth Embodiment)

A substrate processing system according to a sixth embodiment of the present disclosure will be described with reference to FIG. 18. The configuration of the sixth embodiment can be applied to the first to fifth embodiments. In the current embodiment, the substrate processing apparatus system includes a cooling processing apparatus that is separate and different from the reforming processing apparatus as a cooling mechanism for cooling a processed substrate. The substrate unloaded from the reforming processing apparatus is loaded into the cooling processing apparatus and is cooled by the cooling processing apparatus. A film forming processing apparatus and a reforming processing apparatus are similar to those of the first to fifth embodiments.

Figure 18:
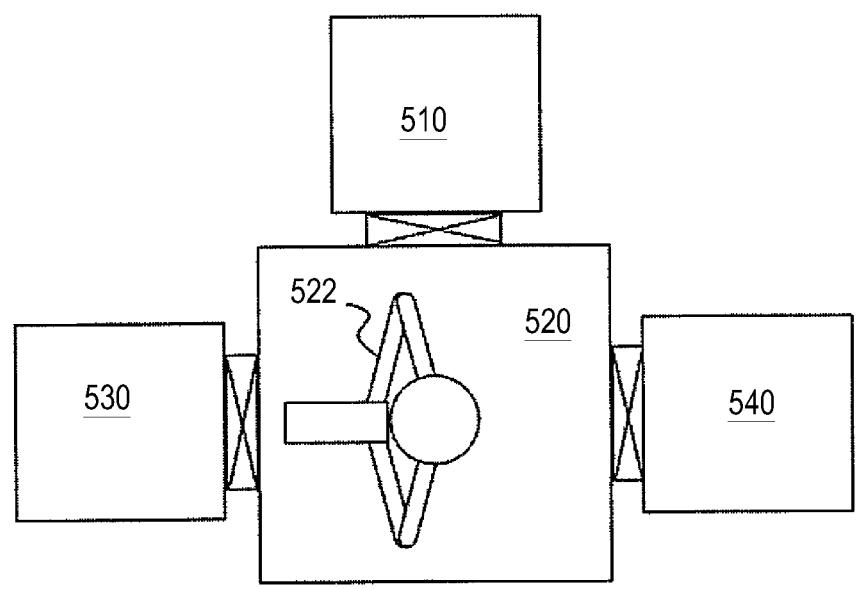
FIG. 18 is a schematic view explaining another embodiment of a reforming processing apparatus according to a sixth embodiment of the present disclosure.

As illustrated in FIG. 18, the substrate processing apparatus system includes a load lock chamber 510, a transfer chamber 520, a reforming processing chamber (corresponding to the processing chamber of the reforming processing chamber relevant to the first to fourth embodiments) 530, and a cooling processing chamber (cooling chamber) 540 having a cooling mechanism. The substrate is loaded from the load lock chamber 510 through the transfer chamber 530 to the reforming processing chamber 530 by the transfer robot 522, and the reforming process is performed on the substrate. After the reforming processing, the substrate is loaded from the reforming processing chamber 530 through the transfer chamber 520 to the cooling processing chamber 540 by the transfer robot 522. The substrate is rapidly cooled within the cooling processing chamber 540. The rapid cooling is performed to control the crystalline property of the film. Since the crystal growth is also in progress while the substrate temperature is falling, a desired crystal structure can be obtained by suppressing the crystal growth and quenching the crystal growth by cooling as rapidly as possible. Therefore, for example, the substrate is cooled within the cooling processing apparatus 540 until the temperature of the substrate becomes 100° C. or less. In addition, the transfer of the substrate by the transfer robot 522, the heating of the substrate, and the cooling of the substrate are controlled by a controller that is not shown.

In addition, while the substrate is cooled within the cooling processing apparatus 540, the throughput can be improved by performing the reforming processing of other substrates in the reforming processing chamber.

(Seventh Embodiment)

Next, a reforming operation by a reforming processing apparatus of a substrate processing apparatus system according to a seventh embodiment will be described. The reforming processing apparatus in the seventh embodiment is similar to that of the first embodiment.

Figure 19:
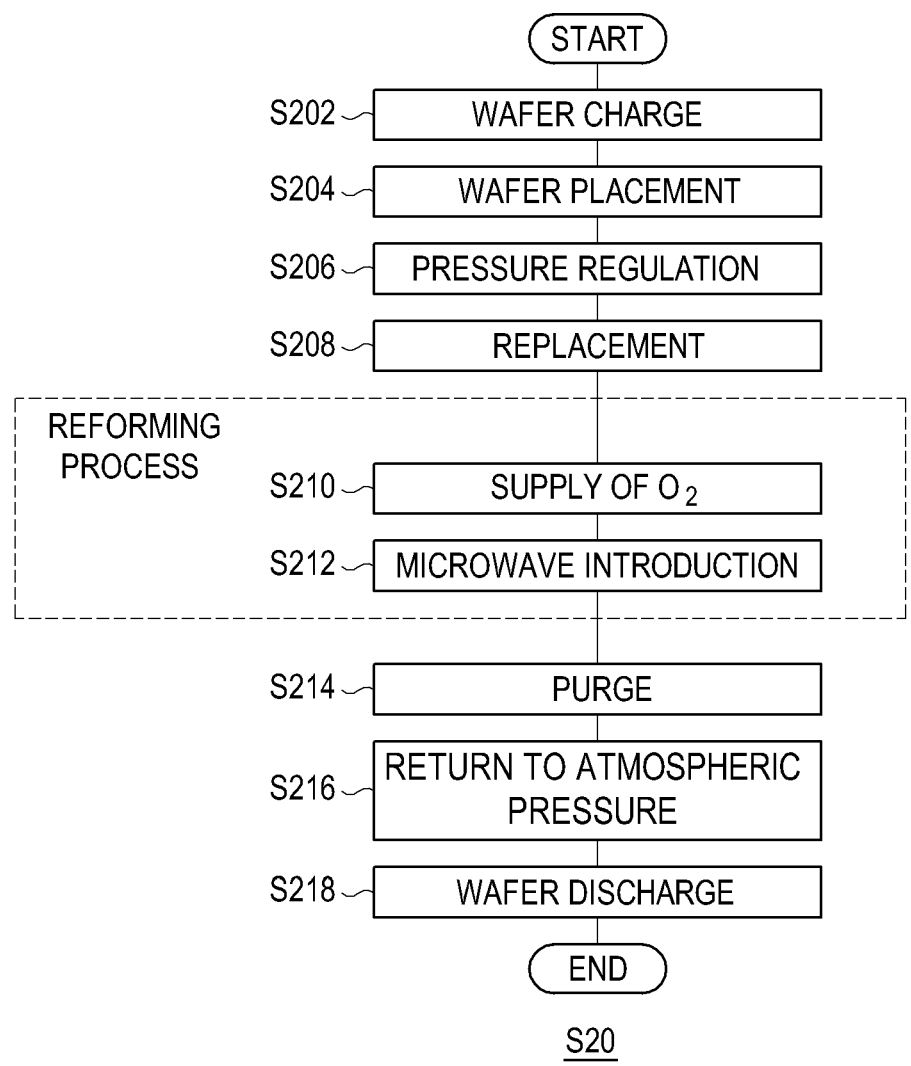
FIG. 19 is a flowchart of a reforming operation of the reforming processing apparatus according to a seventh embodiment of the present disclosure.

FIG. 19 is a flowchart of the reforming operation performed by the reforming apparatus 200.

(Loading Process)
(Step 202)

By opening the gate valve 262, the processing chamber 216 and the transfer chamber 270 communicate with each other. A target wafer 2 on which a TiN film and a $ZrO_2$ film are formed is loaded from the inside of the transfer chamber 270 to the inside of the processing chamber 216 by the transfer robot 274 so that it is supported by the transfer arm 274a (wafer charge).

(Step 204)

The wafer 2 loaded into the processing chamber 216 is placed in the placement groove 234 of the post 232 and is held by the boat 230. If the transfer arm 274a of the transfer robot 274 is returned from the inside of the processing chamber 216 to the inside of the transfer chamber 270, the gate valve 262 is closed (wafer placement).

(Step 206)

The inside of the processing chamber 216 is evacuated by the vacuum pump (not shown) such that it is set to a desired pressure (vacuum degree). At this time, the pressure inside the processing chamber 216 is measured by the pressure sensor (not shown), and the valve V2 is feedback controlled based on the measured pressure (pressure regulation).

(Step 208)

By opening the valve V2, gas (atmosphere) inside the processing chamber 216 is exhausted from the gas exhaust unit 242 and, simultaneously, by opening the valve V1, $N_2$ being an introduction gas is introduced from the gas introduction unit 240 to the inside of the processing chamber 216. After the inside of the processing chamber 216 is replaced with $N_2$ atmosphere, the exhaust and introduction of gas are stopped by closing the valves V1 and V2 (replacement).
(Reforming Process)
(Step 210)

By opening the valve V1, $O_2$ gas is flowed through the gas introduction unit 240 to the inside of the processing chamber 216. $O_2$ gas is supplied into the processing chamber 216 and is exhausted from the gas exhaust unit 242 ($O_2$ supply).

As the reforming gas, in addition to $O_2$, $O_3$, water (moisture, $H_2O$, etc.), and so on, may be used.
(Step 212)

By generating an electromagnetic wave using the electromagnetic wave generating unit 220, the electromagnetic wave is introduced from the waveguide 224 into the processing chamber 216. In addition, by supplying cooling water to the cooling plate 254, the temperature rise of the wall surface 252 is suppressed.

After the electromagnetic wave is introduced for a predetermined time, the introduction of the microwave is stopped (microwave introduction).

If the temperature detector 226 detects that the temperature of the wafer 2 is higher than a predetermined temperature, the controller 300 opens the valves V1 and V2 to introduce $N_2$ gas from the gas introduction unit 240 into the processing chamber 216 and simultaneously exhaust $N_2$ gas inside the processing chamber 216 from the gas exhaust unit 242. In this manner, the wafer 2 is cooled such that it is set to the predetermined temperature.

At this time, by appropriately adjusting the valve V2, the pressure inside the processing chamber 216 is set to a range of, for example, 100 to 100,000 Pa, for example, $5 \times 10^4$ Pa.

The supply flow rate of $O_2$ gas is set to a range of 0.1 to 10 slm, for example, 3 slm.

Time of exposure of the wafer 2 to the $O_2$ gas, i.e., a gas supply time (irradiation time), is set to a range of 10 to 300 seconds, for example, 180 seconds.

The temperature of the wafer 2 is set to be in a range of 100 to 500° C., for example, 250° C.

In this manner, with respect to the $ZrO_2$ film formed on the wafer 2, reformation such as crystal growth, restoration of oxygen defect, or removal of contained impurity is achieved by exciting dipole constituting the $ZrO_2$ film by vibration or rotation.

In addition, in the reforming process, $NH_3$ gas as well as $O_2$ gas may be supplied. Thus, if free Ti exists in the TiN film formed in the metal film forming process, the Ti may be nitrided.
(Unloading Process)
(Step 214)

After the reforming processing, $N_2$ gas as a purge gas is introduced from the gas introduction unit 240. Therefore, gas such as $O_2$ gas remaining within the processing chamber 216 is removed from the processing chamber 216 (purge).
(Step 216)

The inside of the processing chamber 80 in which the internal atmosphere is replaced with $N_2$ gas is returned to normal pressure (atmospheric pressure return).
(Step 218)

By opening the gate valve 262, the processing chamber 216 and the transfer chamber 270 communicate with each other. The processed wafer 2 is unloaded from the boat 230 inside the processing chamber 216 to the transfer chamber 270 by the transfer robot 274 (wafer discharge).

According to the present disclosure, crystal particle growth or crystalline orientation improvement, so-called reforming processing, can be performed by supplying energy by the electromagnetic wave such as a microwave (including a millimeter wave) with respect to the substrate where an insulating thin film having high dielectric constant or a polarized thin film is formed.

In addition, according to the present disclosure, the reforming processing of the thin film can be efficiently performed by selecting a wavelength of the microwave irradiated on the substrate from a bandwidth to which polarization dipole of the thin film responds or in which it is vibrated or rotated.

In addition, according to the present disclosure, the control of the crystalline property is facilitated by controlling a temperature fall profile.

In addition, according to the present disclosure, by prescribing a relative film thickness or relative position of the substrate and the thin film, the reforming processing of the thin film can be effectively performed while suppressing the temperature rise.

In addition, according to the present disclosure, it is possible to suppress the occurrence of the in-plane ununiform distribution of the thin film reforming effect caused by a difference of a local microwave power due to a standing wave generated by the reflection of the microwave.

In addition, according to the present disclosure, it is possible to transfer the microwave power to the thin film to be reformed effectively.

In addition, according to the present disclosure, a microwave is irradiated on a thin film made of a polar molecule to excite the polar molecule in the thin film, thereby performing the thin film reformation such as improvement in crystalline property of the thin film, improvement of film density, and oxidation and nitridation by reactive gas.

In addition, the present disclosure is not limited to the first to seventh embodiments, and various modifications may be made without departing from the scope of the invention.

For example, although an example of supplying $N_2$ gas into the processing chamber when irradiating the microwave in the reforming processing has been described above, a slight amount of $O_2$ gas, instead of $N_2$ gas, may be added. The addition of the $O_2$ gas can support the oxidation of the high-k film.

In addition, although an example of forming a zirconium oxide film as an insulating film being a polarized thin film has been described in the above embodiments, the present disclosure is not limited thereto. The present disclosure can be applied to a compound having a dielectric constant of 8 or more and including 20 atom % or more of any one of silicon (Si), aluminum (Al), hafnium (Hf), strontium (Sr), Zr, and Ti, or a laminated film including them.

For example, the present disclosure can be applied to a hafnium oxide film ($HfO_2$ film), a titanium oxide film ($TiO_2$ film), a zirconium aluminum oxide film (ZrAlO film), a hafnium aluminum oxide film (HfAlO film), a strontium titanium oxide film (SrTiO film), and the like.

In addition, the substrate to be treated is not limited to a semiconductor wafer used in LSI, CMOS, and the like, and it may be a substrate used in LED and the like.

In addition, when the reforming processing of the thin film is performed, the reforming processing of the thin film can be effectively performed by heating as well as irradiation by microwave.

In addition, when the heating is actively used in crystal ion polarization, a millimeter wave of about 30 to 300 GHz band in a microwave region may be used.

In addition, the high-k film may also be used in a capacitor. In this case, a laminated structure of a bottom metal electrode or a top metal electrode may be further utilized. If a microwave of several GHz is used for a metal, arcing may occur damaging a capacitor structure. However, in the case of a microwave of several 10 GHz, it is less likely to cause arcing. Thus, in the case of the capacitor application, it is preferable in some embodiments to use a microwave of, for example, 10 to 40 GHz.

<Aspects of Present Disclosure>

Hereinafter, the preferred aspects of the present disclosure will be additionally stated.

A first aspect of the present disclosure may provide a semiconductor device manufacturing method, which performs a thin film reformation such as improvement in crystalline property of a thin film, improvement of film density, and oxidation and nitridation by reactive gas by exciting a polarized material through the supply of energy by a microwave, and a semiconductor device manufactured using the semiconductor device manufacturing method.

According to a second aspect of the present disclosure, a polarized thin film is a compound having a dielectric constant of 8 or more and including 20 atom % or more of any one of Si, Al, Zr, Hf, Ti, and Sr, or a laminated film including the compound.

According to a third aspect of the present disclosure, a wavelength of the microwave used is set to include a resonant frequency band to which dipole of a material to form a target polarized thin film is responsive.

According to a fourth aspect of the present disclosure, during the reforming, at least one of heating and cooling is performed while irradiating a microwave.

According to a fifth aspect of the present disclosure, at least an insulating thin film is formed entirely or partially on a substrate except an insulator, and a target object meets at least one of a condition where a film thickness of the insulating thin film with respect to the substrate is $1/100$ or less, and a condition where a volume of the insulator with respect to the target object is $1/100$ or less.

A sixth aspect of the present disclosure discloses a substrate processing apparatus including a microwave generating mechanism that is required to excite a target thin film used in the semiconductor device manufacturing methods described in the first to fifth aspects of the present disclosure.

According to a seventh aspect of the present disclosure, in order to control the temperature of the substrate where a thin film is formed during processing, the substrate processing apparatus includes at least one of a heating mechanism or a cooling mechanism within a processing chamber, or a temperature control mechanism within a processing chamber or four kinds of cooling mechanisms in separate chambers for controlling a temperature fall profile after processing.

An eighth aspect of the present disclosure provides a manufacturing apparatus for thin film reformation, which moves a relative position between a substrate and a processing chamber by at least quarter wavelength or more, or agitates a microwave by installing a moving reflective and diffusion plate within the processing chamber, in order to solve in-substrate position dependency of excitation by a microwave due to generation of a standing wave within a processing chamber.

According to a ninth aspect of the present disclosure, a plurality of substrates are installed within the processing chamber in parallel by ensuring a distance of half a wavelength or more of the microwave, and the microwave is introduced on a substrate surface by a waveguide installed in a lateral direction of the substrate.

According to a tenth aspect of the present disclosure, a wavelength of a microwave has at least one frequency of 0.5 to 300 GHz, preferably, 1 GHz to 50 GHz.

An eleventh aspect of the present disclosure provides a semiconductor device manufacturing method including: loading a substrate, on which a high-k film is formed, into a processing chamber; performing a reforming process by heating the high-k film through irradiation of a microwave on the substrate; and unloading the substrate from the processing chamber.

According to a twelfth aspect of the present disclosure, the high-k film is a compound having a dielectric constant of 8 or more and including 20 atom % or more of any one of Si, Al, Zr, Hf, Ti, and Sr, or a laminated film including the compound.

According to a thirteenth aspect of the present disclosure, a frequency of the microwave is selected from a frequency band to which dipole constituting a molecule is responsive.

According to a fourteenth aspect of the present disclosure, a frequency of the microwave is selected based on a frequency characteristic of dielectric relaxation of the high-k film.

According to a fifteenth aspect of the present disclosure, a frequency of the microwave is selected from a frequency band of 0.5 GHz to 300 GHz.

According to a sixteenth aspect of the present disclosure, when the high-k film is reformed, the substrate is cooled or heated while the microwave is irradiated on the substrate.

A seventeenth aspect of the present disclosure provides a substrate processing apparatus including: a processing chamber; a microwave generating device configured to generate a microwave; and a waveguide configured to supply the microwave generated in the microwave generating device to the processing chamber, wherein the microwave generating device is controlled to supply the microwave from the waveguide to the processing chamber accommodating a substrate in which a high-k film is formed.

According to an eighteenth aspect of the present disclosure, the substrate processing apparatus includes a substrate support unit that supports the substrate and has a substrate rotating mechanism, and a control unit controls the microwave generating device and the substrate rotating mechanism such that a relative distance between the center position of the waveguide and the center position of the substrate accommodated in the processing chamber is spaced apart by more than quarter wavelength of the microwave, while supplying a microwave to the processing chamber.

According to a nineteenth aspect of the present disclosure, a reflecting mechanism having a reflective plate configured to reflect a microwave and a reflective plate rotating mechanism configured to rotate the reflecting mechanism are provided inside the processing chamber, and the control unit controls the microwave generating device and the reflecting mechanism to supply a microwave to the processing chamber, rotate the reflective plate, and diffuse the microwave within the processing chamber.

A twentieth aspect of the present disclosure provides a substrate processing apparatus including: a reaction tube or a reaction vessel configured to accommodate a plurality of substrates in which a thin film containing a polarized material is formed; a substrate support member configured to support the substrates stacked within the reaction tube or the reaction vessel; a microwave generating device configured to generate a microwave; and a waveguide configured to supply the microwave generated in the microwave generating device to the reaction tube or the reaction vessel, wherein the substrates are stacked in the substrate support member such that a space having a height of more than half a wavelength of the microwave supplied into the reaction tube is formed on the top surface of the respective substrates, and the waveguide is installed on a sidewall of the reaction tube.

According to the present disclosure in some embodiments, it is possible to provide a semiconductor device manufacturing method and a substrate processing apparatus, which perform crystal particle growth or crystalline orientation improvement, so-called reforming processing, with respect to a substrate on which an insulating thin film having a high dielectric constant is formed.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device manufacturing method, comprising:
    loading a substrate, on which a high-k film is formed, into a processing chamber;
    supporting the substrate with a substrate support unit installed on a substrate support table;
    reforming the high-k film by heating the high-k film through irradiation by microwave on the substrate; and
    unloading the substrate from the processing chamber;
    wherein reforming the high-k film includes, if the temperature of the substrate supported with the substrate support unit exceeds a predetermined temperature during the irradiation by microwave, cooling the substrate to the predetermined temperature while the microwave is irradiating the substrate.

2. The method of claim 1, wherein the high-k film is a compound having a dielectric constant of 8 or more and including 20 atom % or more of any one of Si, Al, Zr, Hf, Ti, and Sr, or a laminated film including the compound.

3. The method of claim 1, wherein reforming the high-k film includes scanning a surface of the substrate by the microwave through rotation of the substrate support table.

4. The method of claim 1, wherein the reforming the high-k film includes operating a diffusing mechanism that reflects and diffuses the microwave.

5. The method of claim 1, wherein supporting the substrate by the substrate support unit includes placing the substrate at a position of quarter wavelength of the microwave from the substrate support table, or a position of an odd multiple of quarter wavelength of the microwave from the substrate support table.

6. The method of claim 1, wherein the microwave irradiating the substrate has a frequency equal to or more than half of a peak frequency unique to the high-k film.

7. The method of claim 1, wherein reforming the high-k film includes varying a frequency of the microwave irradiating the substrate.

8. The method of claim 1, wherein supporting the substrate with the substrate support unit includes setting a distance between the substrate supported by the substrate support unit and a waveguide opening to be shorter than the wavelength of the microwave, and
    wherein the waveguide opening is provided in the top wall of the processing chamber allowing the microwave irradiating the substrate to be introduced into the processing chamber.

9. The method of claim 1, wherein the center position of a waveguide opening is eccentric from the center position of the substrate supported by the substrate support unit,
    wherein the waveguide opening is provided in the top wall of the processing chamber allowing the microwave irradiating the substrate to be introduced into the processing chamber, and
    wherein reforming the high-k film includes scanning a surface of the substrate by the microwave through rotation of the substrate support table.

* * * * *